United States Patent
Kintali et al.

(10) Patent No.: US 9,436,442 B1
(45) Date of Patent: Sep. 6, 2016

(54) AUTOMATIC FLOATING-POINT TO FIXED-POINT CONVERSION

(71) Applicant: The MathWorks, Inc., Natick, MA (US)

(72) Inventors: Kiran Kintali, Ashland, MA (US); Anand Krishnamoorthi, Someerville, MA (US); Srinivas Muddana, Boston, MA (US); Richard M. McKeever, Springfield, MA (US)

(73) Assignee: THE MATHWORKS, INC., Natick, MA (US)

( * ) Notice: Subject to any disclaimer, the term of this patent is extended or adjusted under 35 U.S.C. 154(b) by 27 days.

(21) Appl. No.: 14/097,942

(22) Filed: Dec. 5, 2013

Related U.S. Application Data

(60) Provisional application No. 61/733,505, filed on Dec. 5, 2012, provisional application No. 61/789,680, filed on Mar. 15, 2013.

(51) Int. Cl.
*G06F 9/44* (2006.01)
*H03M 7/24* (2006.01)

(52) U.S. Cl.
CPC . *G06F 8/35* (2013.01); *H03M 7/24* (2013.01)

(58) Field of Classification Search
CPC ............ G06F 8/30; G06F 8/35; G06F 5/012; H03M 7/24
USPC ........................................................ 717/104
See application file for complete search history.

(56) References Cited

U.S. PATENT DOCUMENTS

| | | | |
|---|---|---|---|
| 4,608,554 A | 8/1986 | Blair | |
| 5,561,615 A | 10/1996 | Kuo et al. | |
| 6,144,977 A | 11/2000 | Giangarra et al. | |
| 6,173,247 B1 * | 1/2001 | Maurudis | G06F 9/45504 703/20 |
| 6,460,177 B1 * | 10/2002 | Lee | G06F 8/437 717/146 |
| 6,999,098 B2 | 2/2006 | Leather | |
| 7,231,631 B1 | 6/2007 | Branch Freeman et al. | |
| 7,917,333 B2 * | 3/2011 | Grichnik | G05B 17/02 132/486 |
| 7,934,194 B2 | 4/2011 | Kinnucan, Jr. et al. | |
| 7,969,452 B2 | 6/2011 | Clark et al. | |
| 8,015,543 B1 | 9/2011 | Carrick et al. | |
| 8,135,570 B2 | 3/2012 | Linebarger et al. | |
| 8,166,452 B2 * | 4/2012 | Kinnucan, Jr. | G06F 8/10 703/14 |
| 8,180,964 B1 * | 5/2012 | Koh | G06F 11/3442 711/118 |
| 8,407,271 B2 | 3/2013 | Hurd et al. | |
| 8,418,097 B2 * | 4/2013 | Raghavan | G06F 17/5009 716/105 |
| 8,448,130 B1 | 5/2013 | Pillarisetti et al. | |
| 8,484,262 B1 | 7/2013 | Bryan | |
| 8,495,114 B1 | 7/2013 | Bryan et al. | |
| 8,645,439 B2 * | 2/2014 | Kinsman | G06F 7/38 708/204 |
| 8,706,964 B1 * | 4/2014 | Koh | G06F 12/0888 711/118 |

(Continued)

OTHER PUBLICATIONS

Converting models from Floating Point to Fixed point for Production Code Generation; Bill Chou and Tom Erkkinen—MATLAB Digest—2008 (Security Password on Doc, content encrypted and cannot be attached).*

(Continued)

*Primary Examiner* — Francisco Aponte
(74) *Attorney, Agent, or Firm* — Cesari and McKenna, LLP

(57) ABSTRACT

A method and system for enabling a designer to more easily convert a model of a dynamic system instantiated using floating-point representation such as has been created in a high level design language to fixed-point code suitable for execution in a programmable processor or logic array.

20 Claims, 25 Drawing Sheets

(56) References Cited

U.S. PATENT DOCUMENTS

| | | | | |
|---|---|---|---|---|
| 8,782,618 B1* | 7/2014 | Gaudette | | G06F 8/40 717/136 |
| 8,924,938 B2* | 12/2014 | Chang | | G06F 11/3688 717/126 |
| 9,038,016 B2* | 5/2015 | Kinnucan, Jr. | | G06F 8/10 717/104 |
| 9,075,630 B1* | 7/2015 | Smith | | G06F 8/443 |
| 9,081,595 B1* | 7/2015 | Delarue | | G06F 9/44589 |
| 2004/0128119 A1* | 7/2004 | Maurudis | | G06F 9/45504 703/14 |
| 2005/0065990 A1* | 3/2005 | Allen | | G06F 9/45504 708/495 |
| 2007/0266368 A1* | 11/2007 | Szpak | | G06F 8/10 717/105 |
| 2008/0040409 A1* | 2/2008 | Matsuzaki | | G06F 8/443 708/204 |
| 2009/0007063 A1* | 1/2009 | Szpak | | G06F 8/10 717/105 |
| 2009/0083358 A1* | 3/2009 | Allen | | G06F 9/45504 708/495 |
| 2011/0113125 A1* | 5/2011 | Bruna | | H04L 1/0003 709/220 |
| 2012/0254827 A1 | 10/2012 | Conrad et al. | | |
| 2012/0259904 A1 | 10/2012 | Bishop | | |
| 2012/0331444 A1* | 12/2012 | Szpak | | G06F 8/10 717/105 |
| 2013/0145347 A1* | 6/2013 | Karr | | G06F 8/75 717/113 |
| 2014/0059524 A1* | 2/2014 | Kee | | G06F 8/34 717/154 |

OTHER PUBLICATIONS

An Algorithm for Converting Floating-Point Computations to Fixed-Point in MATLAB based FPGA design—Sanghamitra Roy, Prith Banerjee—Northwestern University—DAC'04, Jun. 7-11, 2004, San Diego, California, USA.*

AccelDSP Synthesis Tool Floating-Point to Fixed-Point Conversion of MATLAB Algorithms Targeting FPGAs by: Thomas Hill—Xilinx FPGAs—Apr. 19, 2006.*

A Stochastic Approach for the Range Evaluation—Andrei Banciu; A Stochastic Approach for the Range Evaluation. Signal and Image process-ing. Universit_e Rennes 1, 2012.*

Design and Implementation of Numerical Linear Algebra Algorithms on Fixed Point DSPs—Zoran Nikolí and Gene Frantz,DSP Emerging End Equipment and Application Specific Products, Texas Instruments Inc-Ha Thai Nguyen,Coordinated Science Laboratory, Department of Electrical and Computer Engineering,University of Illinois at Urbana—EURASIP 2007.*

An Automated Floating-Point to Fixed-Point Conversion Methodology Changchun Shi and Robert W. Brodersen Berkeley Wireless Research Center, Department of EECS, University of California, Berkeley, USA—2003.*

Automated Floating-point to Fixed-point Conversion with the fixify Environment—Pavle Belanovíc and Markus Rupp CD Laboratory for Design Methodology of Signal Processing Algorithms Vienna University of Technology, Austria—Proceedings of the 16th International Workshop on Rapid System Prototyping 2005—IEEE.*

Floating-point to Fixed-point Transformation using Extreme Value Theory—Linsheng Zhang, Yan Zhang, Wenbiao Zhou—Department of Electronic and Information Engineering Harbin Institute of Technology Shenzhen Graduate School Shenzhen 518055, China—2009 Eigth IEEE/ACIS International Conference on Computer and Information Science.*

"Guy and Seth on Simulink—An Ounce of Design Min/Max is Worth . . . " MATLAB Central Blog, Nov. 15, 2012, 4 pages.

Static program analysis. (Mar. 22, 2016). In Wikipedia, The Free Encyclopedia. Retrieved 14:16, Mar. 30, 2016, from https://en.wikipedia.org/w/index.php?title=Static_program_analysis&oldid=711385436.

Banerjee, P., "An Overview of a Compiler for Mapping MATLAB Programs onto FPGAs", Department of Electrical and Computer Engineering, Northwestern University, 2003, 6 pages.

* cited by examiner

▼ Fixed Point Conversion – dti.prg                                                                              – + X ⇧  [3.14]   714  711
Run Simulation  Compute Derived   Function ƒx dti  ▶        ● Propose fraction lengths
                Ranges ▼                                    ○ Propose word lengths
                                                            Default word length 16       ⊙         △        ▽
| Range Analysis | Function Replacements | Static Analysis Output ▶ |   More Settings ▼   Validate Types  Verify Numerics
                                                             715              718            719

| Setting | Value |
|---|---|
| Safety margin for sim min/max(%) | 0 |
| △ Default fimath | cfimath |
| Propose types using design ranges and Simulation and derived ranges |  |
| Optimize whole numbers | Yes |
| Propose signedness | Yes |
                                                                                        750

```
 1  function (y, clip_status) = dti(u_in)
 2  % Discrete Time Integrator in MATLAB
 3  %
 4  %
 5  % Forward Euler method, also known as Forward Rectangular
 6  % approximation.  The resulting expression for the output
 7  % step 'n' is y(n) = y(n-1) + K * u(n-1)
 . . .
23     clip_status = -2;
24  elseif (u_state >= limit upper)
```

| Variables | Function Replacements | Static Analysis Output ▶ |
|---|---|---|

| Variable | Type | Sim Min | Sim Max | Static Min | Static Max | Whole Number | Proposed Type |
|---|---|---|---|---|---|---|---|
| ▼Input |  |  |  |  |  |  |  |
| u_in | double(1x1) | -1 | 1 | -1 | 1 | No | numerictype(1,16,14) |
| ▼Output |  |  |  |  |  |  |  |
| clip_status | double(1x1) | 0 | 0 | -2 | 2 | Yes | numerictype(1,3,0) |
| y | double(1x1) | 2 | 320.31 | -500 | 500 | No | numerictype(1,16,6) |
| ▼Persistent |  |  |  |  |  |  |  |
| u_state | double(1x1) | 2 | 320.31 | -501.01 | 501.01 | No | numerictype(1,16,6) |

*FIG. 11*

```
Run Simulation ▼  Compute Static  Functions fx dti ▶      ● Propose fraction lengths
                  Ranges ▼                                ○ Propose word lengths
                                                          Default word length: 16
─────────────────────────────────────────────────────────────────────────────────
Range Analysis          │ Navigation                      │ Type Proposal
─────────────────────────┴──────────────────────────────────────────────────────
1  function [y, clip_status] dti (u_In)
2  % Discrete Time
3
4  %
5  % Forward Euler              Slim Range:      -1         : 1         gular, or
6  % approximation                                                      utput of th
7  % step 'n' is y              Static Range:    -1         : 1
8  %
9                               Proposed Type:   numerictype(1,16,14)
10 init_val = 1;
11 gain_val = 1;                Rounding Method: Floor ▶
                                                                      └─ 1310
                                Overflow Action: Wrap ▶
```

FIG. 13

```
23    clip_status = -2;
24 elseif (u state >= limit upper)
```

| Variables | Function Replacements —1410 | | |
|---|---|---|---|
| Function or Operator | Fixed-Point Replacement | Replacement required to use fixed-point | |
| fft | Click to add | | |
| Click to add | | | |

| Variables | Function Replacements | Verification Output ▶ |

1510

Static Analysis Output
Simulation Output
Type Validation Output

✓ Verification Output

Begin Fixed Point Simulation ; dti
Generating Mex file for 1 'dti_wrapp

Warning: Overflow or saturation occurr
represented in its type.

Warning in ==> dti_FixPt Line: 27 Column: 23
Code generation successful (with warnings) : View report

| | 734 | 735 | 736 | 737 | 738 | |
|---|---|---|---|---|---|---|
| | Sim Max | Static Min | Static Max | Whole Number | Proposed Type | |
| | | | | | 1910 | |
| 4.11 | 4.11 | | | | erictype (2,12,20) | |
| −0.21 | −0.21 | | | Copy sim range | erictype (2,12,20) | |
| 0.2 | 0.2 | | | Copy sim ranges for all top level images | erictype (2,12,20) | |
| 1.41 | 0.01 | | | Copy sim ranges for all persistent variables | erictype (2,12,20) | |
| −1 | | 1 | | Clear the static range | erictype (2,12,20) | |
| 0 | | 0 | | Clear all normally entered static ranges | | |
| −0.32 | | 38.31 | | Reset entire table | erictype (2,12,20) | |
| −1.22 | 1.22 | | | No | numerictype(2,12,20) | |

742 — To run static analysis, you must enter the static ranges for input variables. Entering known ranges for other variables will also improve analysis. Click Compute Static Ranges again after entering data.

FIG. 19

| | | |
|---|---|---|
| No | | numerictype(0,32,30) |
| No | | numerictype(0,32,33) |
| No | | numberictpe(1,32,30) |
| No | ▶ | numerictype(1,32,26) |
| No | | numerictype(1,32,31) |
| Yes | | |
| No | | numerictype(1,32,30) |
| No | | numerictype(1,32,30) |

FIG. 20

| Setting | Value |
|---|---|
| When proposing code | use all collected data ▶ |
| Optimize whole numbers | Yes |
| Signedness | Automatic |
| Safety margin for sim min/max ( ) | 0 |
| Generated fixed-point file name suffix | fixpt |
| Transform for-loop index variables | No |
| ▲ fimath | |
| Rounding method | Floor |
| Overflow action | Wrap |
| Product mode | FullPrecision |
| Sum mode | FullPrecision |

2400

9   -0.13   No   numerictype(1,32,33)

AUTOMATIC FLOATING-POINT TO FIXED-POINT CONVERSION

CROSS REFERENCE TO RELATED APPLICATIONS

This application claims the benefit of the filing date of U.S. Provisional Application Ser. No. 61/733,505 filed on Dec. 5, 2012 entitled AUTOMATIC FLOATING POINT TO FIXED POINT CONVERSION and U.S. Provisional Application Ser. No. 61/789,680 filed on Mar. 15, 2013 entitled AUTOMATIC FLOATING POINT TO FIXED POINT CONVERSION. The entire contents of each of these applications is hereby incorporated by reference.

BACKGROUND

For quite some time it has been common for engineers to use a number of computer-based tools to assist with the design process. Various modeling environments, both textual and graphical, can automatically produce either deployable software systems or descriptions of hardware systems that mimic the behavior of either the entire model or portions of the model. Such production of code from a model is often referred to as "code generation."

Products such as the MATLAB® development environment available from The MathWorks, Inc. of Natick, Mass. provide a high-level language and interactive modeling environment for numerical computation, visualization, and programming.

BRIEF DESCRIPTION OF THE DRAWINGS

FIG. 8 is an example user interface screen where one or more simulations are run.

In FIG. 9, a user has activated an example computation of static ranges.

In FIG. 10, the user has finished running an example static analysis.

In FIG. 11 the user is using additional example settings to specify further attributes.

FIG. 13 is an example pop-up window displaying information about a variable or an operator.

FIG. 14 is an example specification for function replacement.

FIG. 15 illustrates an example log window selection view for selecting a build type output.

FIG. 19 shows an example of how ranges for input variables may be manually specified in a table.

FIG. 20 shows further example features of the table interface.

FIG. 24 is an example option window where the user can specify how the code will be generated.

DETAILED DESCRIPTION OF EXAMPLE EMBODIMENTS

Figure 1:
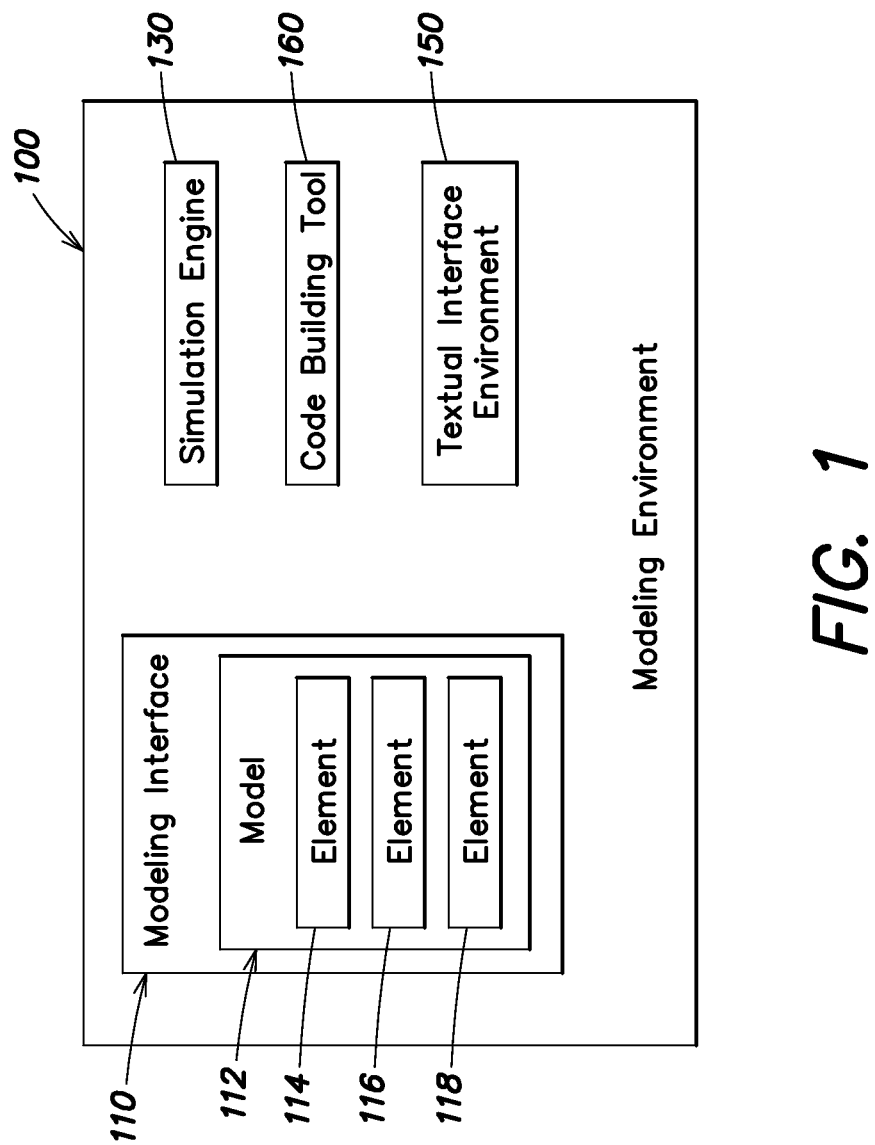
FIG. 1 is a high-level block diagram of an example modeling environment.

Typically, modeling environments use a single implementation of code during a code generation process and do not allow a user to customize the code based on availability of multiple implementations of code for a portion of the model or the entire model. As a result, the code that is generated using the code generation process can be insufficient for many applications where specific design requirements need to be met.

As one example, a development environment may allow a designer to develop a code-based model of a system using high level programming language constructs, such as those available through a toolbox. Models of signal processing algorithms are typically specified using floating-point variables and floating-point operations as a starting point. However, for power, cost, and performance reasons, the models are typically implemented with fixed-point variables and operations either in software for DSP cores or as special-purpose hardware in FPGAs. The fixed-point conversion process can be very challenging and time-consuming, for example, 25 to 50 percent of the total design and implementation time. Manually converting floating-point code and/or hardware to fixed-point code is thus quite challenging and may require lots of repetitive, tedious and error prone tasks.

By way of brief introduction, the systems and methods described here enable a new workflow that permits a designer to start with a floating-point design in a high level language environment such as MATLAB, easily and iteratively converge on an efficient fixed-point design, and then verify the numerical accuracy of the generated fixed-point design. These automated tools simplify and accelerate the conversion process.

In one aspect, a code generation system and method provide a floating-point to fixed-point conversion workflow used in the context of a modeling environment. The workflow generally includes:

providing a floating-point design model compatible with code generation, such as providing an instrumented model code;

providing either initial design ranges for floating-point variables, or a test bench with which the instrumented model may be used;

if the test bench is provided, simulating the instrumented code to provide a set of simulated ranges;

using either the design ranges or the simulation ranges as a starting point, computing an initial estimate of fixed-point types from a static analysis of the code; and deriving proposed fixed-point variable types including a sign, total word length and/or fraction length settings from the static analysis.

In other aspects, the workflow may continue by optionally generating a fixed-point design using the proposed fixed-point variable types; verifying the generated fixed-point design using the same test bench as used initially; and/or comparing a resulting numeric accuracy of the generated fixed-point design with the original floating-point design.

In some embodiments, the workflow may determine an initial set of ranges for the static analysis from the instrumented simulation. Optionally, these initial ranges may be manually specified by the designer. In either event, these range estimates are then fed to the static analysis to further refine the proposed variable types.

As part of determining a proposed fixed-point variable type, the workflow may include accepting user input specifying one or more of a rounding method, overflow action, signed-ness, optimization for whole numbers, safety margin, transform for-loop index variables, product mode, or sum mode.

Other aspects of the workflow involve user interfaces of a particular type. In one example interface, a table view may present a list of variables from the floating-point design model and includes, for each such variable:

the simulation range including minimum and maximum values resulting from simulation;

the static range including minimum and maximum values resulting from the static analysis; and the proposed fixed-point variable type.

In still other aspects, the table view may allow the designer to provide manual input representing a modification to a proposed fixed-point variable type, a sign, a word length and/or fractional part of a variable, or test bench stimuli.

The workflow also supports simulating the fixed-point design model using the original floating-point test bench stimuli. This can be used to generate a plot that is presented to the user, showing a behavior of the original floating-point variable, a behavior of the resulting fixed-point variable, and an error plot. This view may provide the user with further insight into whether the proposed variable types meet design requirements.

The user interface may also initiate a log of the simulation to present an interactive histogram view of the values of a variable encountered during the simulation. The interactive histogram view displays a histogram of values resulting from the simulation along with a manipuable bounding box. The user can move the window with respect to the bounding box to visually determine a suitable proposed type for the variable. For example, modifying a position of the bounding box can change a word size parameter of the proposed fixed-point variable type, and moving a selected side of the bounding box can indicate a change to a fractional length of the proposed fixed-point variable type.

I. Example System Environment

Embodiments of the methods and systems described in this document allow a user to specify or generate a model in a modeling environment and to generate code from the model. The generated code can be represented in a hardware description language, such VHDL (very high speed integrated circuit hardware description language) or Verilog, or in a programming language, such as the C, C++ or JAVA™ programming languages. The model can originate as a textual model in a textual modeling environment, such as MATLAB® from The MathWorks, Inc. in one embodiment. However, it is also possible for the model to originate using a graphical modeling environment, such as Simulink® from The MathWorks, Inc., UML™ (unified modeling language), or any of a number of other modeling environments.

An implementation of code can be specified for an element in a model, a part of an element in a model, multiple elements in a model, algorithmic aspects in a model, etc. An implementation of code, as referred to herein, can represent a fragment of code in a programming language, such as C, C++, System C, the JAVA™ programming language, the JAVASCRIPT™ scripting language, etc., or in a hardware description language, such as VHDL or Verilog. An implementation of code may also be represented by a high level abstraction of code, such as an intermediate representation. An implementation of code can represent a "template," such that the implementation of code can provide a basic structure and syntax, but additional data or code may be added to more completely represent a portion of a model. As an example, an implementation of code may provide a template such that either fixed-point or floating-point values can be instantiated. An element, as referred to herein, can be a segment of text or a graphical affordance, and can represent algorithmic aspects of a model. The implementations of code may allow a user to generate code that achieves certain performance or design characteristics. Each portion of a model can have multiple corresponding implementations of code that are each developed to meet various performance or design requirements.

A user interface can be provided that allows a user to develop implementations of code that can be used in the code generation process. In this manner, a user can provide user-developed implementations of code that are directed to unique aspects or requirements of the user's model.

FIG. 1 is a high-level block diagram of an example modeling environment 100 for modeling, simulating, and analyzing dynamic systems. The modeling environment 100 may include a modeling interface 110, a simulation engine 130 (or an interface to a simulation engine), a textual interface 150, and a code building tool (also called a code generator) 160.

The modeling environment 100 allows a user to develop models in the modeling interface 110. Using the modeling interface 110, a user can create a model 112 that includes, for example, an element 114, an element 116 and an element 118. The elements can be, for example, textual objects that model a system, such as a dynamic system. The user may use predefined elements or user-specified elements to develop a model.

The textual interface 150 may allow a user to develop a user-defined element with a sequence of commands in a textual language. The textual interface 150 can also facilitate debugging and/or profiling of a model. Alternatively, implementations of the modeling environment 100 may include a separate debugger and profiler.

The simulation engine 130 may communicate with the modeling interface 110. The simulation engine 130 can receive a model such as, for example, a block diagram model, a state diagram model, a UML model, a text-based model (e.g., a sequence of commands), etc., that is generated using the modeling interface 110. The simulation engine 130 can convert the model created in the modeling interface 110 to an executable form, referred to as a compiled model. The simulation engine 130 can repetitively execute the compiled model e.g., via successive time steps from a simulation start time to a stop time specified by the user or until the simulation is interrupted. Alternatively, the simulation engine 130 may enable interpretive simulation of the model. The simulation engine may be instrumented and thus capable of working with models implemented as instrumental code. Thus, when a reference is made herein to simulating a model, that reference should be understood to be a shorthand reference to execution of a compiled version of the model and/or interpretive execution of the model to observe an expected behavior of the underlying system represented by the model.

The code building tool 160 can be used to automatically generate code, such as source code, object code, a compiled executable or library for forming an executable of a model provided by the modeling interface 110. The code building tool uses implementations of code for portions of a model to generate executable code, instructions, etc. in a programming language such as Java, Javascript, C or C++ or other C-like language, or a hardware description language (HDL) such as Verilog or VHDL. To generate code the code building tool can convert a source model language representation of a model to a target language. The code building tool 160 may comprise an extended version of a code building tool such as MATLAB Coder, HDL Coder, and/or Real-Time Workshop® from The MathWorks, Inc. of Natick, Mass. or any portion thereof, or may be substantially any software component for generating executable code, instructions, etc., in a programming language such as Java or C or in a hardware description language such as Verilog or VHDL.

The code building tool 160 can generate source code for the execution of a model that is provided by the modeling interface 110, and can compile the source code into object code and build an executable program, library or substantially any other form of executable instructions. The code may be designed to run on any processor, microprocessor, dual-core processor, multi-core processor, cluster of processors, operating system, computational hardware device, component of a computational hardware device, etc. In one embodiment, the code may comprise embedded code targeted to run on an embedded system. Additionally, the code can be customized to run on a specific target hardware platform. For example, the code generated may include fixed-point code to run a fixed-point processor or code can be generated to emulate fixed-point behavior on a floating-point processor.

One of ordinary skill in the art will also appreciate that the components of the modeling environment 100 may be provided on the same computing device, as described below with reference to FIG. 2, or alternatively, the components of the modeling environment 100 may be coupled to each other via a communication network, as described below with reference to FIG. 3.

Figure 2:
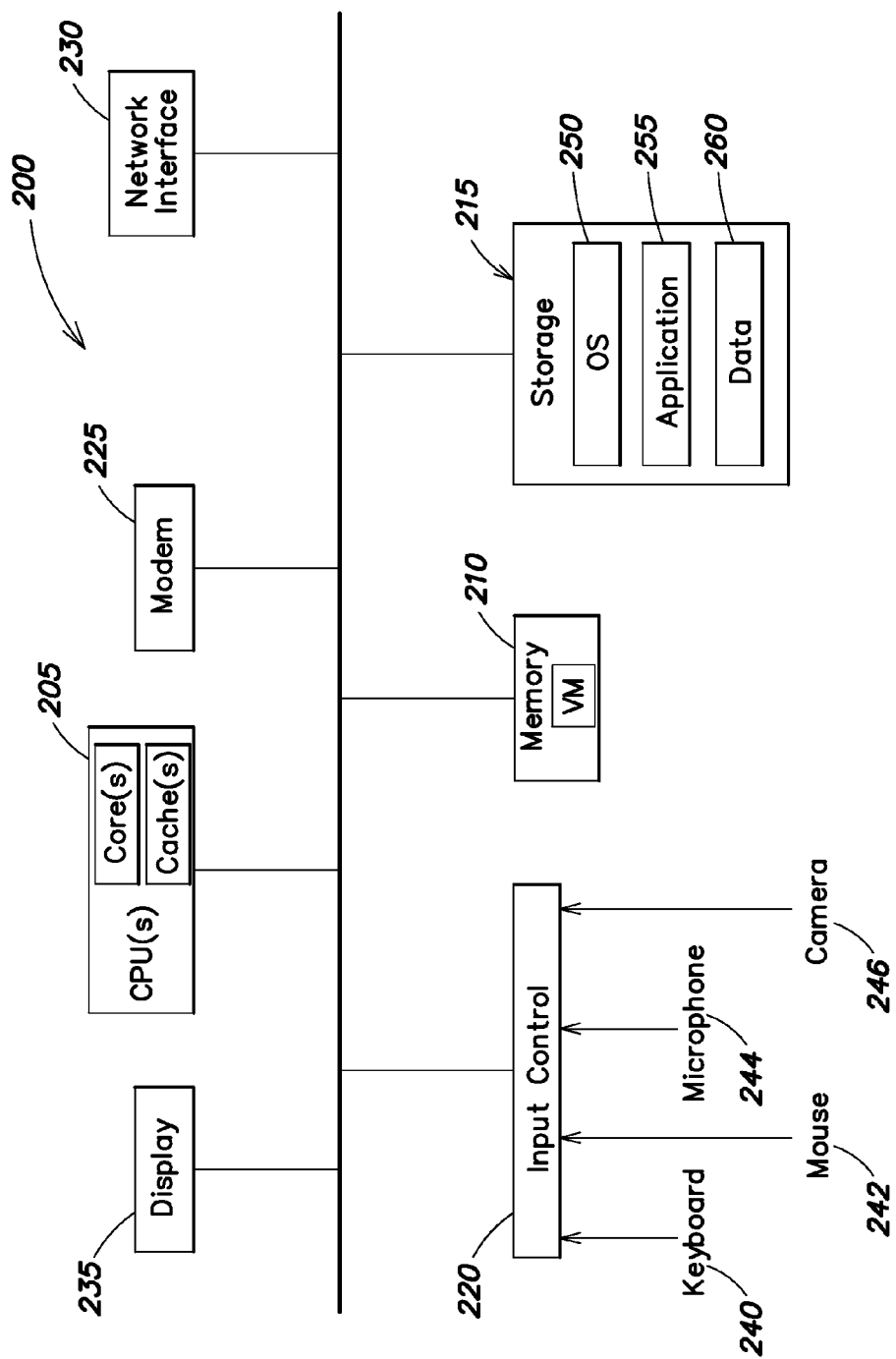
FIG. 2 is an example computing device suitable for implementing the modeling environment.

FIG. 2 is an example computing device 200 suitable for practicing embodiments discussed herein. One of ordinary skill in the art will appreciate that the computing device 200 is intended to be illustrative and not limiting. The computing device 200 may take many forms, including but not limited to a personal computer, workstation, server, network computer, optical computer, Internet appliance, mobile device, a pager, a tablet computer, and the like.

The computing device 200 may be an electronic data processor and may include a processing unit such as Central Processing Unit (CPU) 205, memory 210, storage 215, an input control 220, a modem 225, a network interface 230, a display 235, etc. The CPU 205 may control components of the computing device 200 to provide the modeling environment 100, modeling interface 110, simulation engine 130, textual interface environment 150, and/or code building tool 160. The memory 210 temporarily stores instructions and data and provides them to the CPU 205 so that the CPU 205 operates the computing device 200 and may run the modeling interface 110, simulation engine 130, textual interface environment 150, and/or code building tool 160, based on the stored instructions.

Optionally, the computing device 200 may include multiple CPUs 205 for executing software loaded in the memory 210, and other programs for controlling system hardware. Each of the CPUs 205 can be a single or a multiple core processor. The code loaded in the memory 210 may run in a virtualized environment, such as in a Virtual Machine (VM). Multiple VMs may be resident on a single processor. Also, part of the application could be run in hardware, for example, by configuring a field programmable gate array (FPGA), using an application specific instruction set processor (ASIP) or creating an application specific integrated circuit (ASIC). Further, part of the application may be run on analog electronic devices or other resources may be used to run part of the application, such as graphics processing units (GPUs) or dedicated hardware such as Fast Fourier Transform (FFT) processing blocks.

The storage 215 may contain software tools for applications. The storage 215 can include code 250 for the operating system (OS) of the device 200, code 255 for applications running on the operating system including the applications for the modeling environment 110, simulation engine 130, textual interface environment 150, and code building tool 160. The storage 215 may also store and retrieve data 260 generated from the modeling environment 100, simulation engine 130, textual interface environment 150, and code building tool 160. Those of ordinary skill in the art will appreciate that parts of the applications can be stored in the CPU cache or memory 210 as well, much like the data, and even the OS, or they can be stored on the network described below with reference to FIG. 3.

The input control 220 may interface with a keyboard 240, a mouse 242, a microphone 244, a camera 246, such as a web camera, or other input devices. The computing device 200 may receive, through the input control 220, input data, such as the input data for developing a model. The computing device 200 may display on the display 235 user interfaces for displaying the data generated from the modeling environment 110, simulation engine 130, textual interface environment 150, and code building tool 160.

Figure 3:
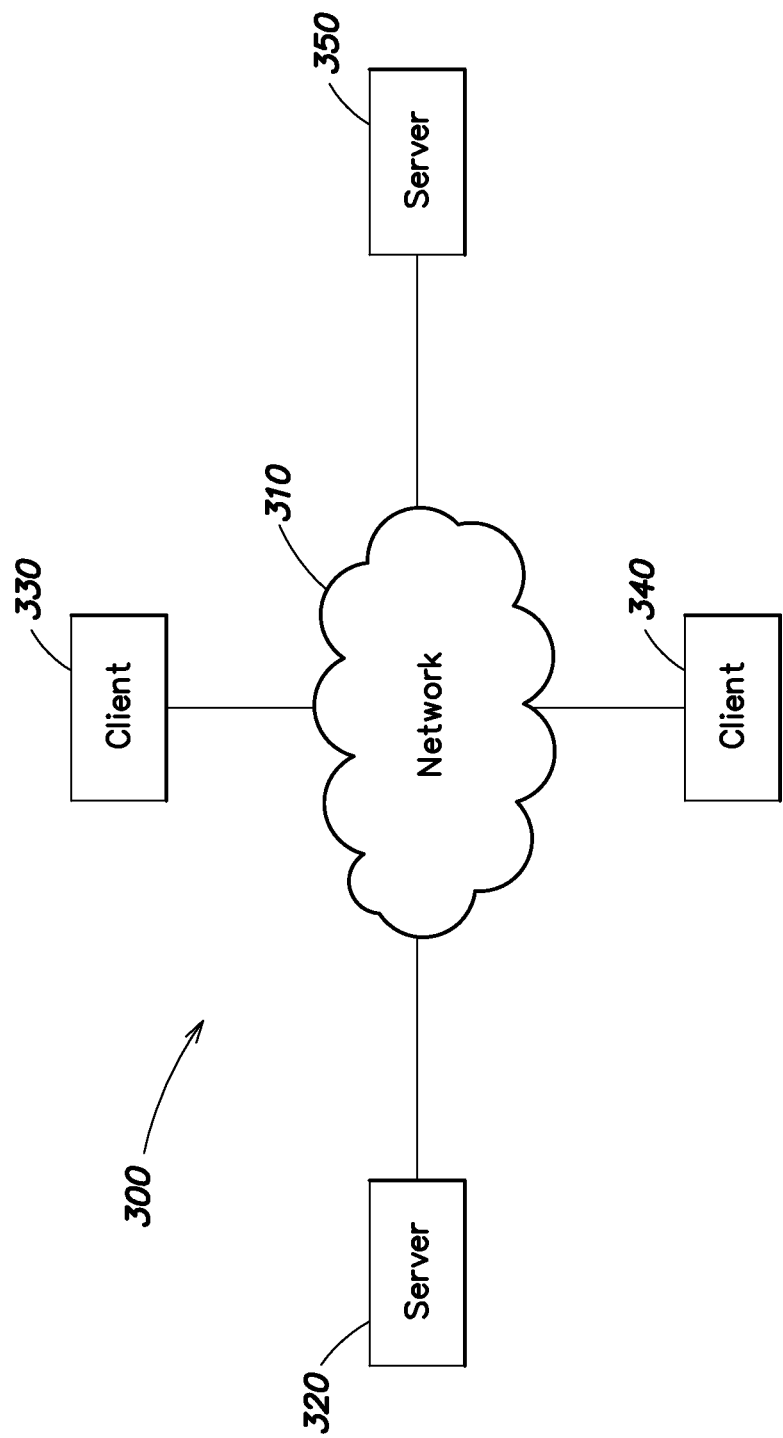
FIG. 3 is an example network environment.

FIG. 3 is an example network environment 300 suitable for a distributed implementation of embodiments of the computing device 200. The network environment 300 may include one or more servers 320 and 350 coupled to clients 330 and 340 via a communication network 310. The computing device 200 can thus be implemented using one or more servers 320 and 350 communicating with clients 330 and 340 through the communication network 310 as a distributed application program. The communication network 310 may include Internet, intranet, LAN (Local Area Network), WAN (Wide Area Network), MAN (Metropolitan Area Network), wireless network (e.g., using IEEE 802.11 and Bluetooth), etc. In addition the network may use middleware, such as CORBA (Common Object Request Broker Architecture) or DCOM (Distributed Component Object Model) to allow a computer on the network to communicate directly with another computer or device that is connected to the network.

In the network environment 300, the servers 320 and 350 may provide the clients 330 and 340 with software components or products under a particular condition, such as a license agreement. The software components or products may include those for providing the modeling environment 100 and/or implementations of code for select elements. The software components or products may also include those for the modeling interface 110, simulation engine 130, textual interface environment 150, and code building tool 160.

In one example, the client 340 may perform the modeling of a dynamic system using a software component provided by the server 320 and send the server 320 the model for simulation. The server 320 may return the simulation results to the client 340 and the client 340 may subsequently display the data to the user with the information on the data.

In another example, the client 340 may have the modeling environment 100 installed and may desire additional implementations of code for select models. The client 340 may have implementations of code that are already loaded on the client 340 or may have to download each implementation of code the client 340 desires. In either case, the server 320 may store implementations of code that the user can download. The user may be charged a fee to download the implementation of code. The implementation of code may be specialized code that provides an advantage over an implementation of code the client 340 already has.

In another example, the client 340 can access the server 320 and/or 350 to access a repository of implementations of code. The implementations of code in the repository can be maintained and updated by an administrator. The repository can serve as a central location to access implementations of code for the clients 330 and 340. The clients may also be able to upload implementations of code to the repository. Alternatively, the clients 330 and 340 can access the repository of implementations of code via a network such as the Internet to download or upload implementations of code. The implementations of code may be put under version control in the repository and may have information as well as index terms associated with them. The information can be text or any other format for information storage such as the eXtended Markup Language (XML).

Figure 4:
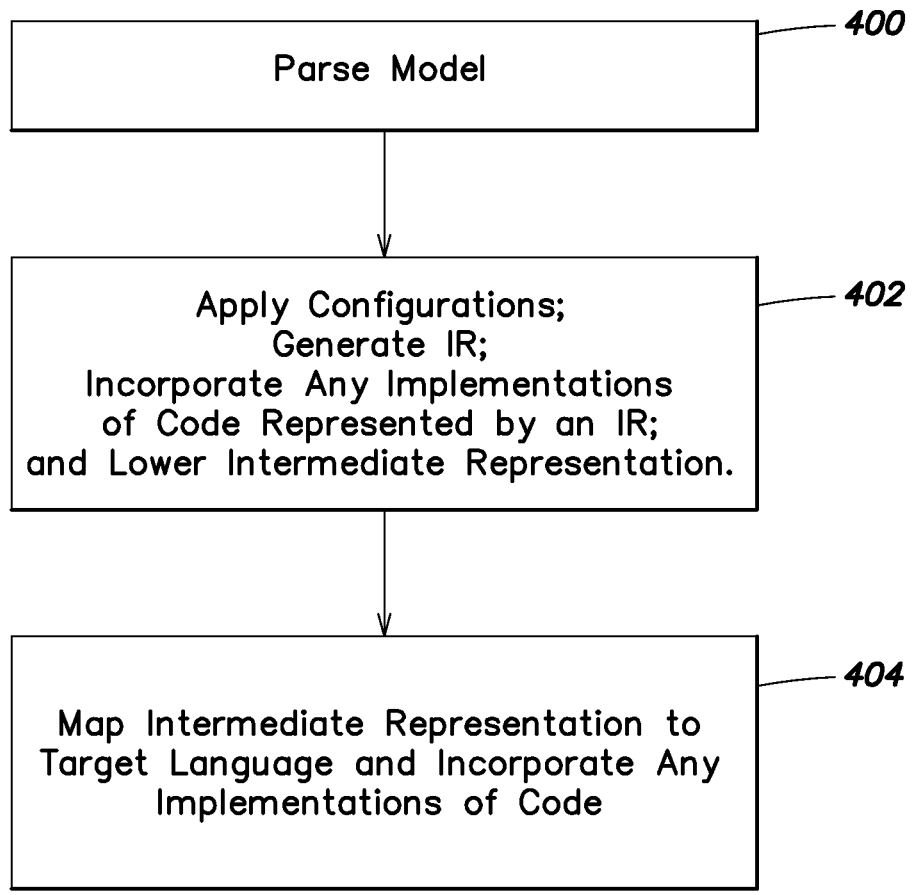
FIG. 4 is a high level flow diagram of an example process for generating code for a model.

FIG. 4 is a high level flow diagram that provides an example process for generating the code for a model. In one example, to generate code after the selection of implementations of code is complete, the code building tool 160 parses the model into syntactical components (block 400). Subsequently, embodiments of the present disclosure may apply code configurations, construct an intermediate representation (IR) and may lower the IR (block 402). In some embodiments, a selected implementation of code may represent an IR.

The implementation of code that is represented by the IR may be incorporated into the IR that is constructed in block 402. Likewise in some embodiments, a selected implementation of code may be represented in a programming language or a hardware description language. An implementation of code of this type may be incorporated by the process in a later step. The order of the processing performed in block 402 may vary. For example, an intermediate representation may be constructed and lowered and then the code configurations can be applied. Code configurations can be applied to portions of the model or to the entire model. The intermediate representation can be, for example, a control flow graph or a data flow graph. The intermediate representation may be lowered into an intermediate representation that provides non-language specific and primitive constructs that may be used by many different languages, such as C, C++, VHDL or Verilog or the intermediate representation may be lowered into an intermediate representation that provides specific language and constructs that are directed to a specific language. The code is then generated by mapping the syntax and semantics of the intermediate representation to the syntax and semantics of the target language, and any specified implementations of code that are represented by a programming language or a hardware description language are incorporated into the code (block 404).

In some instances, a user may not specify implementations of code for all portions of the model. In this case, the modeling environment 100 may propagate a selected implementation of code from one portion of the model to another portion of a model. For example, the user may specify an implementation of code for a first portion of a model that maximizes the speed of execution for that portion, but may not specify an implementation of code for a second portion of the model that is connected to the first portion of the model. The implementation of code specified for the first portion of the model may propagate to the second portion of the model, such that if the second portion of the model has an implementation of code that corresponds to maximizing the execution speed, the modeling environment can select that implementation of code for the second portion of the model.

II. Example Floating to Fixed Tool Architecture and Workflow

Figure 5:
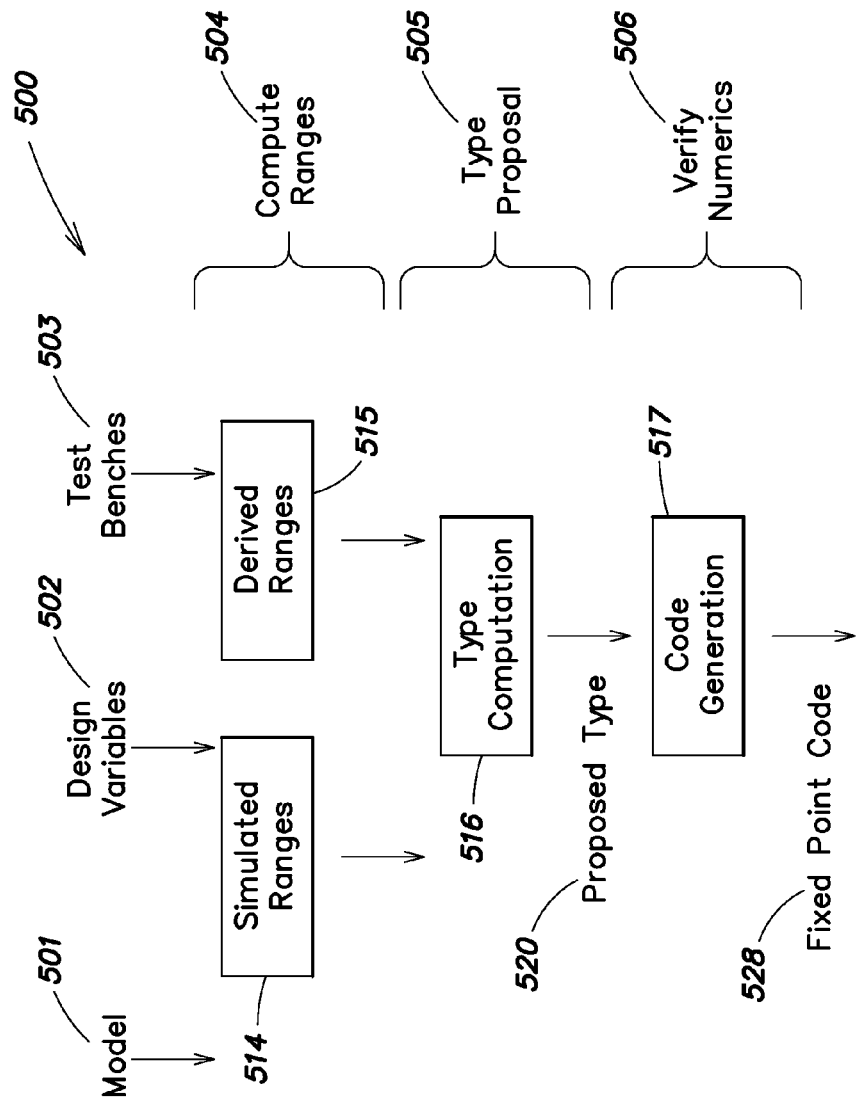
FIG. 5 is a more detailed example workflow for code generation.

An example high-level workflow for a floating to fixed code generation tool 500 is shown in FIG. 5. The user (e.g., a circuit or code designer) provides several inputs, including a design (also called the model herein) 501, a set of design variables 502 (e.g., the model may indicate floating-point types and expected ranges for code variables), and one or more test benches 503 that can be used to test the executable code against various conditions.

The workflow may automate several tasks in an example embodiment, including, but not limited to, (a) Compute Ranges 504 (from both an instrumented simulation 514 as well as derived from static code analysis 515), (b) Type Proposal 505, and (c) Verify Numerics 506. The workflow can automate these tasks as:

computing simulation ranges 514 from the model 501 and testbench 503 results (from, for example, an instrumented simulation such as the buildInstrumentMex API in MATLAB Coder and the Fixed-Point Toolbox)

computing static derived ranges 515 from the model 501 and design variables 502 (e.g., using a MathWorks Polyspace based static analysis engine or other abstract interpretation-based static analysis method suitable for automatically evaluating the semantics of the code-based model)

a type computation proposal 516 process that involves computing a proposed type 520 from the results of simulated ranges 504 and derived ranges 505 and then presenting this information so that the user can then review and iterate before generating fixed-point code 528 in the code generator 517.

The resulting proposed type 520 for the variable(s) to be converted includes a fixed word length and fraction length settings.

It should be understood that the automatic floating-point to fixed-point conversion workflow described here may be implemented in a number of different code development environments. In the particular example discussed in detail here a designer begins by generating code for the design such as in a MATLAB® development environment. The generated MATLAB code is then run through the automatic floating-point to fixed-point conversion workflow and/or other optimizations resulting in optimized MATLAB code. The designer then generates code to be used in his or her implementation from the revised MATLAB code, resulting in for example C code, HDL code or similar code from the optimized MATLAB code.

However other code development environments may also implement the floating-point to fixed-point workflows described here. For example, the development environment may be a graphical modeling environment as described above. However, in other embodiments, the modeling environment can also be text-based or standalone. The original MATLAB code can also be provided in the content of other modeling environments. For example, the designer may specify MATLAB code as a piece of a Simulink® model; the revised MATLAB code can then be reinserted in the Simulink model.

FIG. 5 shows a forward direction work flow starting with the model 501 and resulting in fixed-point code 528. However, a design process may be iterative where the user may repeat and redo a number of steps in the flow. For example, the proposed type for a variable or an operator may not be acceptable. The user may specify different fixed-point code generation options and resubmit it to the simulated ranges 514 and derived ranges 515 operations. Similarly, the user may be unsatisfied with a resulting fixed-point code 528 and begin the overall process once again. The user may also begin by hand coding the MATLAB code as an initial step and feeding that back into the automated process, or other aspects such as the histogram view or the code verification process.

Figure 6A:
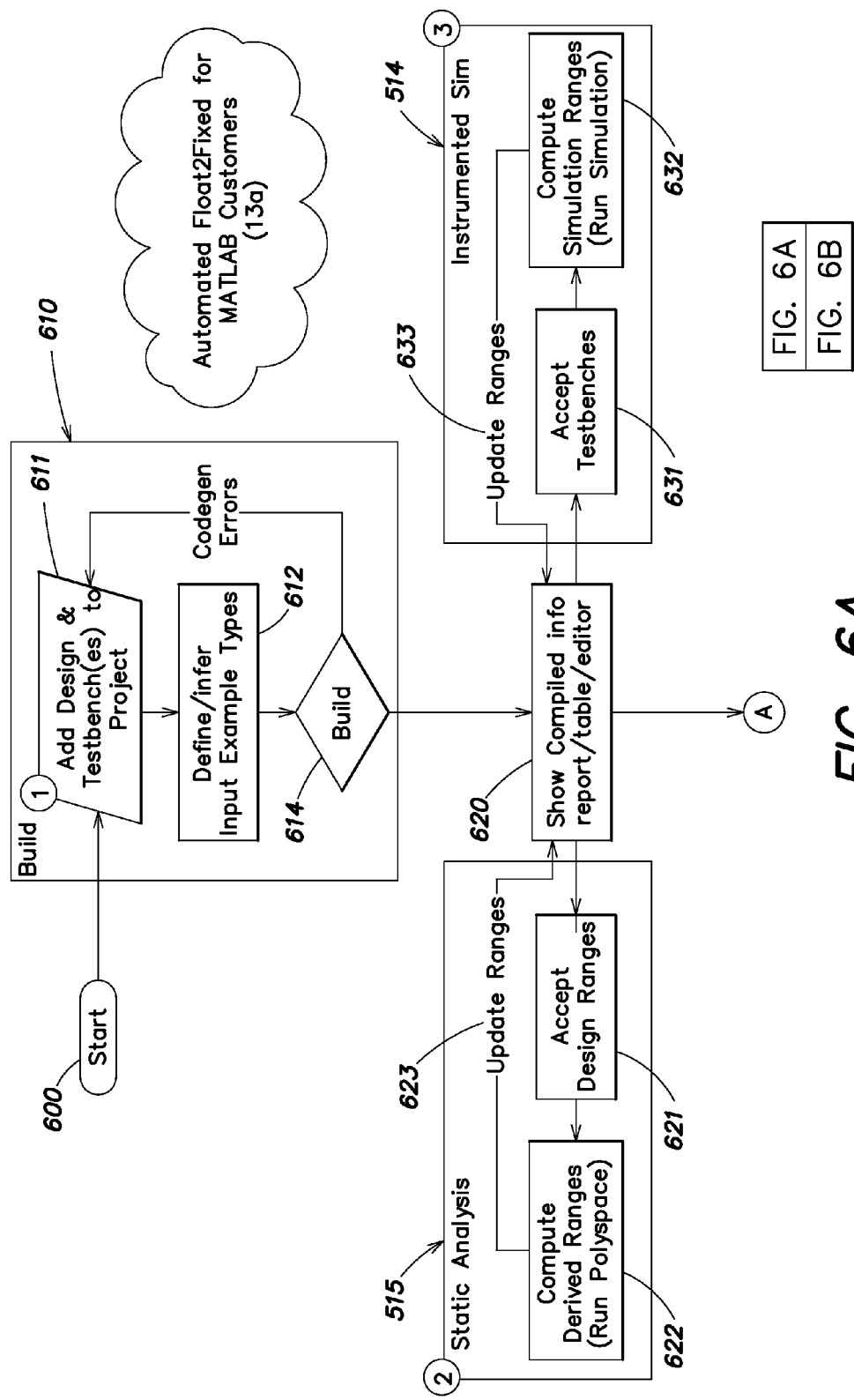
FIGS. 6A and 6B show a more detailed example workflow for a floating to fixed point conversion process.
Figure 6B:
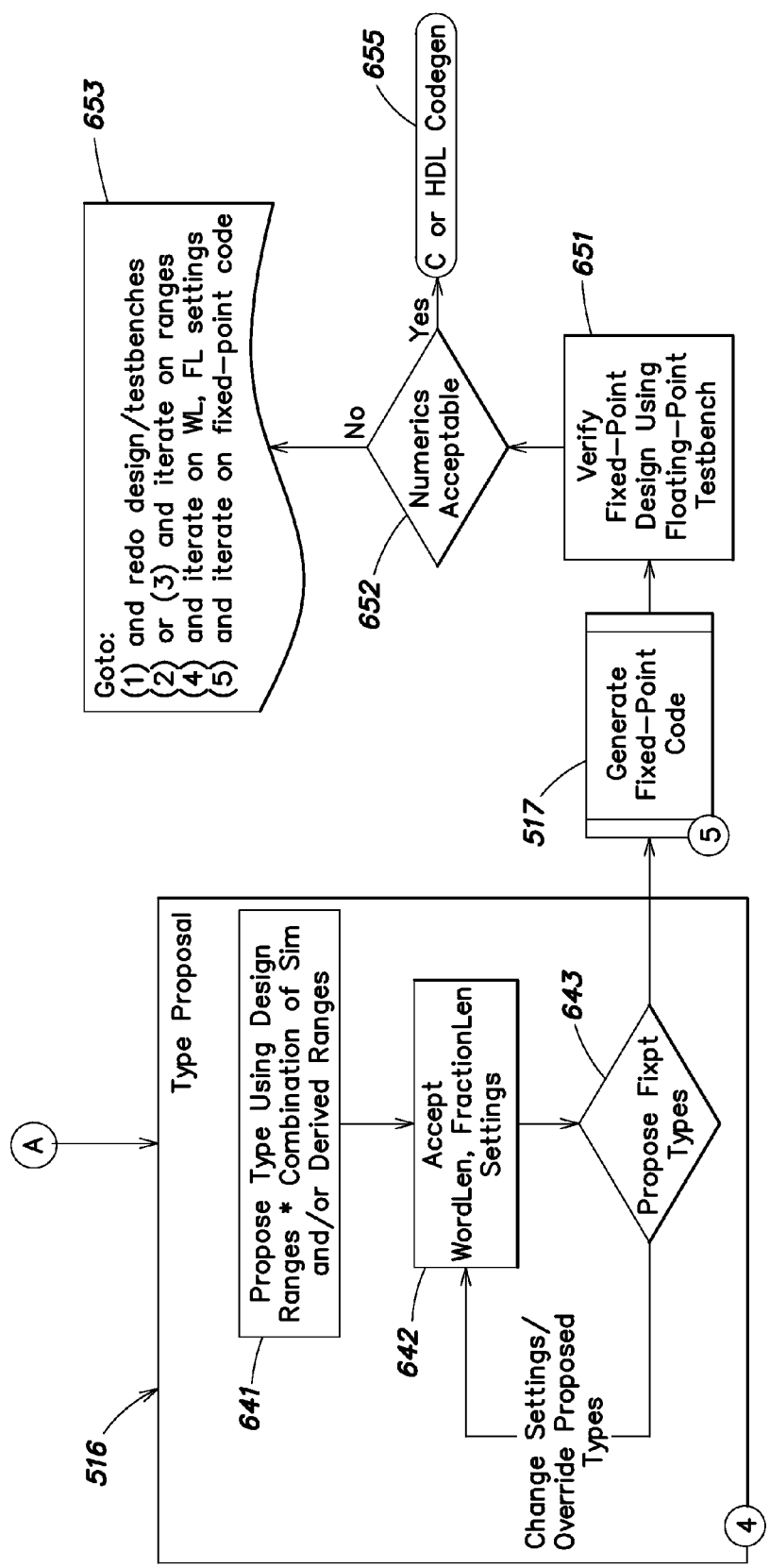

FIGS. 6A and 6B are a more detailed workflow showing an Initial Build 610, Static Analysis (Derived Ranges) 515, Instrumented Simulation (Simulated Ranges) 514 Type Proposal (Type Computations) 516 and Generate Fixed-point Code (Code Generator) 517 actions. It should be understood that these figures illustrate one possible implementation of the workflow and that other arrangements are possible.

From an initial start block 600, the build block 610 may begin. The model and available test benches may be added to the project in block 611. Input example types may be defined and/or entered in block 612. In block 614 the build then may begin; if there are code generation errors in the build, processing then may iterate back to block 611. Otherwise the process may continue to block 620 where the compiled information may be shown as a report, in table form and/or as editable text.

In block 620, a complied information report may be provided. The compiled information report may take the form of a table of variables and status information for the type conversion work flow, as described in more detail below. The table may or may not include initial design ranges provided from the model.

From block 620 the user may request static analysis 515 or may choose to run the instrumented simulation 516. The user may select these in any order (as indicated by the flow arrows in FIG. 6). The instrumented simulation 516 may be run first in some instances to provide a starting point for the static analysis 515.

In the static analysis 515, the resulting design ranges may be accepted in block 621. Derived ranges may then be statically computed, such as by running a Polyspace algorithm, in block 622. More generally, static analysis 515 may make use of abstract interpretation techniques to develop a representation of the dynamic semantics of the instrumented code model. The abstract representation is then subjected to a computational analysis by propagating the input ranges through the model code. This analysis may determine the expected ranges of input variables (from either design ranges as specified by the user, or from prior simulation results) and examine the specified operations on these variables, to derive expected ranges for output variables.

In one simple example, if two input variables can each be represented by a fixed-point 8-bit word, and the operator specified in the model is an addition of those two variables, it is known that the output of the addition operation can be represented by 9 bits. In a case where the operator is a multiply of two fixed-point variables, one variable of 4 fixed bits and one of 3 fixed bits, then the output variable may require 12 bits for representation.

The updated static ranges may then be shown in block 623 to the user and processing may return to block 620.

It is also possible to enter instrumented simulation 516 from block 620. In block 631, the user may be requested to accept the test benches. The process may compute the simulation ranges, such as by running a simulation, in block 632. Updated simulation ranges may be displayed in block 633, and processing may return to block 620.

From block 620 an initial type proposal 516 process may begin. In block 641, proposed types using the initial design ranges (if available) and a combination of the simulated 623 and derived 633 ranges may be presented to the user. In block 642, the user may be asked to accept the proposed, signedness, word length and fraction length settings. Here, in block 643, the user may also see the proposed fixed-point types. The user may then iterate back to block 642, changing the fixed-point type proposal settings and/or overriding the automatically proposed types.

At this point the process may generate the fixed-point code in block 517. The user may verify the fixed-point code design using the floating-point test bench(es) in block 651. If the test bench results are acceptable in block 652, the user may proceed to C language or HDL code generation in block 655. If the results are not acceptable, then processing may proceed to block 653 where a number of actions may be possible. At this point, the design and/or test benches may be redone; the user may iterate on the ranges or the word or fraction length, and/or otherwise iterate other actions until the generated fixed-point code is satisfactory.

In some embodiments, the user may interact with the automated fixed-point conversion workflow tool in its various actions as per the flow of FIG. 6 via a number of user interface screens. In a first example screen illustrated by FIG. 7, the user may have initiated the automated fixed-point conversion tool. A toolbar 710 running across the top provides options such as selecting a function to be converted 711, running simulations 712, computing derived ranges 714, reviewing proposing changes 715 to fraction and word length, and other advanced options 716.

Figure 7:
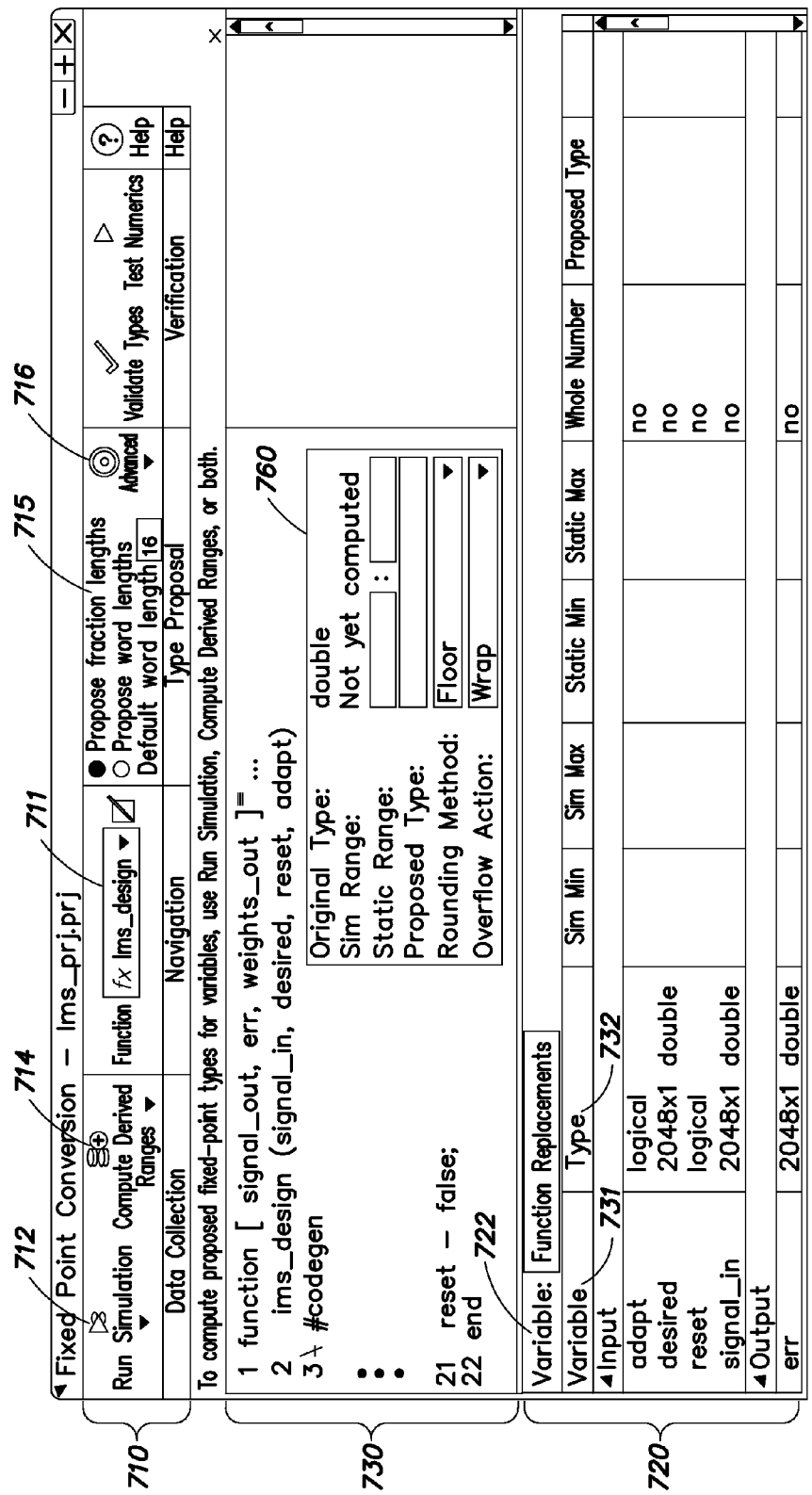
FIG. 7 is an example user interface screen.

In this initial state shown in FIG. 7, the user may be examining a list of variables shown in a table 720 extracted from the model code. In some embodiments, the code 730 may be shown in a central portion of the screen, for reference, where the code may not be editable in this view. When the user selects a particular variable (here, the user has clicked or mouse hovered over the variable "adapt" in the code), the tool may cause a pop up window 760 to appear. The window 760 may indicate the status of the work flow for that variable "adapt" including original design variable type, the state of the simulated range (here, the simulated range has not yet been computed), state of the static range (not yet determined), a proposed type (not yet computed), rounding methods selected (here a floor method is to be used), overflow actions (here a wrap method is to be used), and possible other states.

The user may also be able to review a list of variables in the code to be converted in the table 720 at the bottom of the screen accessible by clicking on a tab 722. A list of variable names appears in a first column 731 of the table and a second column 732 lists the corresponding type declarations in the model code.

For the variables, the user may (re)compute and propose (via tool option 715) specific fraction lengths for a given fixed word length setting, or word lengths for a given fixed fraction length setting. When starting with a floating-point design and going through the floating-point to fixed-point conversion for the first time, a 'Default Word Length' setting may be specified based on the largest dynamic range of all the variables in the design. In this example, the user has chosen to start with a default word length of 16.

Figure 8:
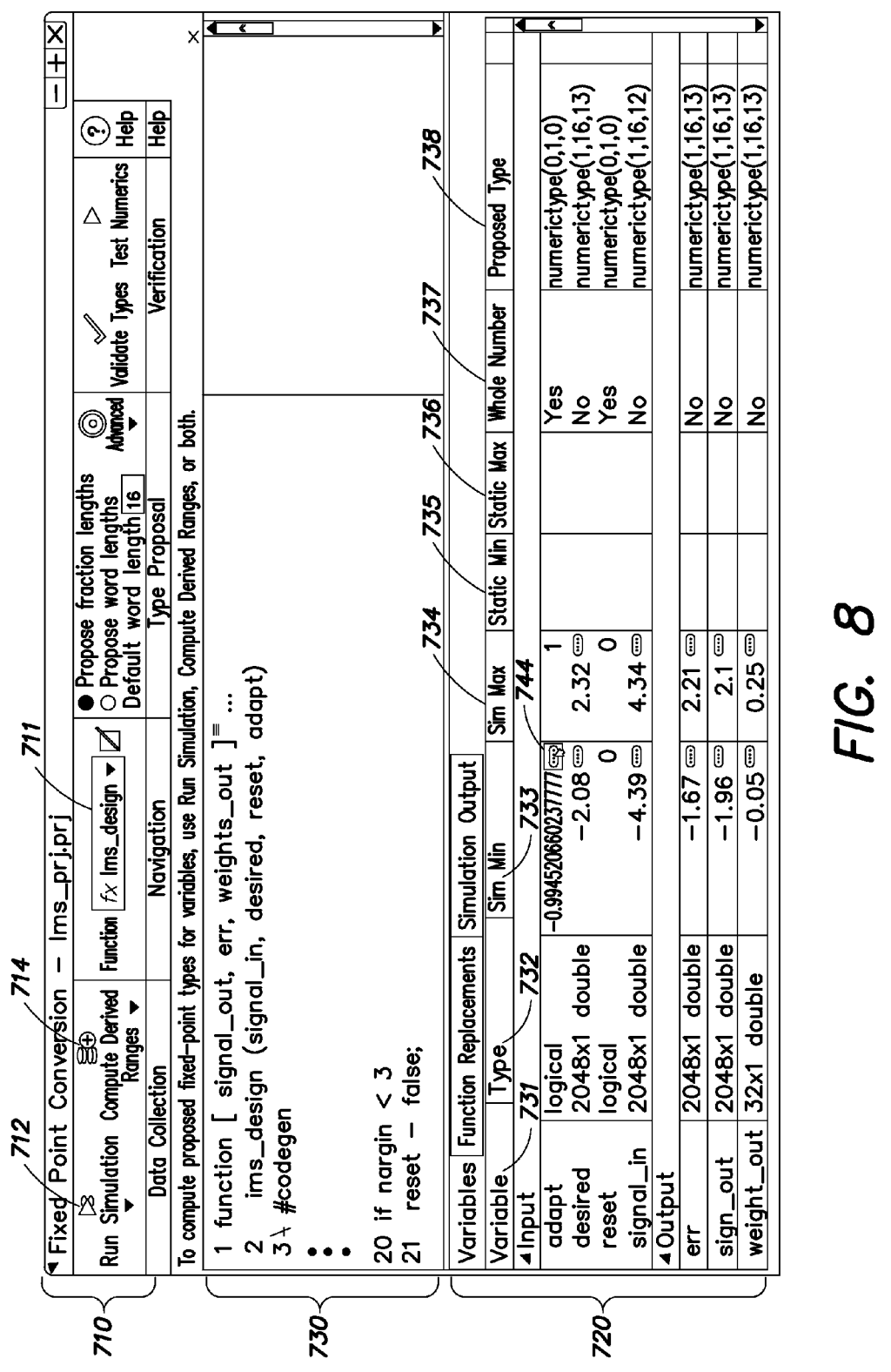

In a state illustrated by FIG. 8, the user has started running one or more simulations to determine simulated ranges for the variable of interest by clicking on Run Simulation 712. Here a simulation is an execution of the instrumented code using the test bench. The results of the simulation, once complete, are displayed in columns 733 and 734 of table 720. The resulting minimum and maximum simulation values are taken from a log of the instrumented simulation run.

As can be seen in the right-most column 738, a proposed fixed-point data type may also be automatically offered for each variable. The proposed type may include a first value indicating whether it is to be a signed variable or not (0 for unsigned, and 1 for signed), a second value indicating the total number of bits in the fixed length word, and a third value indicating the fraction length (e.g., indicating the bit position of the decimal point) in the fixed-point representation.

Figure 9:
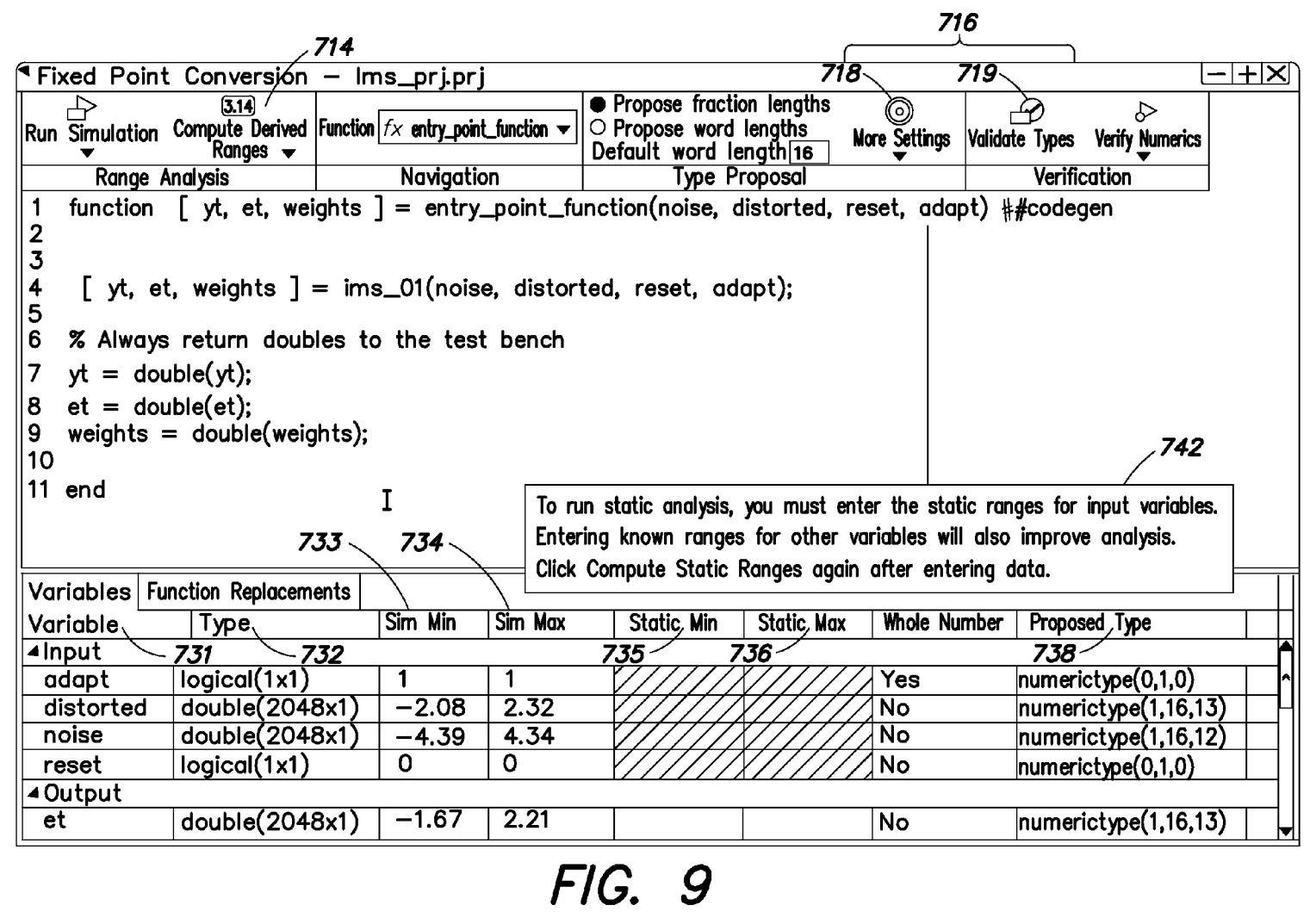

In FIG. 9, the user has activated button 714 to compute static ranges. If the variables in the table at columns 735 and 736 are empty, the user may be prompted via a window 742 to enter static ranges manually or to propagate them from a prior simulation that has been run (e.g. to copy them from columns 733 and 734 to columns 735 and 736).

Figure 10:
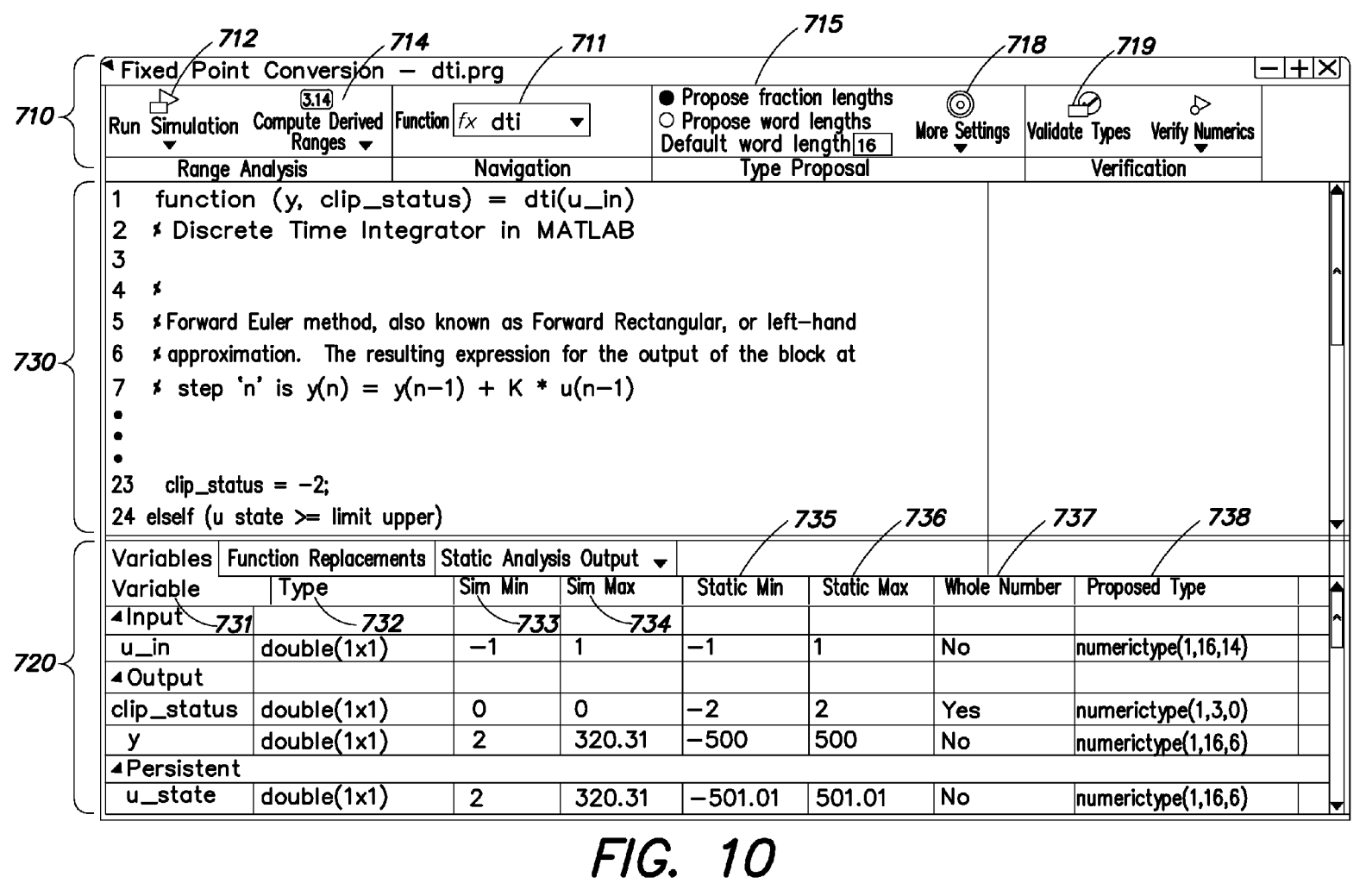

In a screen shown in FIG. 10, the user may have finished running the polyspace-based static analysis and obtained new static minimum and static maximum values. The new static minimum and maximum values are shown in columns 735 and 736; the proposed types 738 are also updated.

At the point in the process shown in FIG. 10, the user may also manipulate the computed ranges via a histogram view that provides user interface controls that can be utilized by to adjust the numeric type, as will be described in greater detail below in connection with FIGS. 21-23.

III. Specification for an Example Implementation

In an example embodiment, a user may have specified a design for a digital signal processor, such as an adaptive filter design using floating-point arithmetic as a MATLAB project file. The use of MATLAB is merely exemplary and aspects of the work flow can be implemented using other code development and/or technical computing environments without departing from the spirit of what is intended to be covered by this patent application.

At launch of the example Project file within the fixed-point conversion work flow tool, the following process may occur:

1. Initial Setup

The Fixed-Point conversion analysis may be performed in a separate tool, which may be the MATLAB Editor, or a dialog with an embedded read-only instance of the MATLAB Editor.

The user may be presented with a choice of not converting to fixed-point, or converting automatically.

If the user decides to convert automatically, then the tool may be used to define fixed-point types, and that information may be used to generate fixed-point C code or HDL code when the project is built.

The user may choose to convert automatically, and may go through a partial floating to fixed-point workflow. The user may later return to an original model without implementing a proposed conversion.

When the Fixed-Point Tool is launched, it may build an instrumented MEX file (to use for the simulation). If one has already been built, it may be updated, if desired.

If the build fails, a failure log may be displayed with a button to retry it, and the rest of the tool may be disabled.

If the user decides to implement a proposed fixed point conversion, the attributes of the conversion may be stored in a MATLAB project file, which may be an original MATLAB file that contained the model, or another MATLAB project file. The user may convert code in several sessions, or in a hierarchy of code pieces, for example, for a large project. Progress through the work flow may be stored and maintained in the project file along with failure logs, code verification results, and so forth. With this approach the original floating-point design remains unchanged while several variations of fixed-point designs can be realized that optimize for area, speed, and power considerations by tweaking word lengths and fraction length settings and generating different fixed-point code in each iteration.

2. Computing Ranges and Types

Returning attention to FIG. 7, in an illustrative embodiment, the leftmost two buttons in the tool ("RunSimulation" 712 and "Compute Derived Ranges" 714) may offer ways of computing ranges and proposing the resulting types.

The user may request either or both range computations, in any order, one or more times. The results may be merged as the workflow proceeds.

When the user clicks on Run Simulation 712, there may be a file dialog to choose the test file, for example, if it has not already been chosen somewhere else in the Coder GUI (e.g. Autodefine Types). The file may then immediately run with automatic redirection to the instrumented MEX file, and the output may be displayed while it is running, as shown in the table 720 FIG. 8. The output, as shown, may include minimum 733 and maximum 734 value ranges presented in the table 720 as determined from the simulation. Also shown is an initial proposed type 738 derived from those ranges 733, 734.

These ranges may be rounded off in the table 720, for example, to two decimal places as shown for ease of viewing. However if the user "mouse hovers" proximate to or over the ellipsis (" . . . ") 744 next to a value in the ranges in table 720, the complete, higher precision value may be shown. See FIG. 8 at 744 for an example.

Prior to executing the test file, the instrumented MEX file may be automatically rebuilt if relevant code has changed since a last successful build.

The drop-down for Run Simulation 712 may also show a multi-select list of known test files, with an option to add or remove a test file (not shown in the figures).

When Compute Static Ranges 714 is clicked, it may determine if required design ranges have not been entered, and the user may be alerted to this. See item 742 in FIG. 9. The user may, for example, enter ranges manually or have ranges copied from an earlier run simulation 712.

Clicking on Compute Static Ranges 714, once design ranges have been entered, may result in the static analysis being run, with the output appearing, similar to Run Simulation, in corresponding columns in the table. When finished, the updated static minimum and maximum data 735, 736 as well as updated proposed types information 738 may be displayed. See FIG. 10.

The proposed types 738 may be automatically updated, for example, when a setting is changed by the user that serves as direct input to the type proposal (e.g., the integer flag on each variable, the word length vs. fraction length proposal radio buttons, etc.). Settings that are not direct inputs to type proposal (e.g., static analysis options) may not trigger an automatic update.

Proposal settings (e.g., basic type proposals) may be embedded in the tool strip 710 such as at item 715. Additional settings may also be provided on a More Settings 718 drop-down button. Changing any of these settings may result in automatic re-computation of the proposed types 738. See FIG. 11 for an example, More Settings window 750. The available options may include indicating a safety margin for the simulation min/max, a default fixed math (fimath) function, whether proposed types are to be determined from both the simulation and derived ranges, or only one of them, whether the type proposal should be optimized for whole numbers (e.g., integers), and whether signedness should be proposed.

3. The Table

The table 720 shown below the code 730 may display variables for the selected file, grouped by kind (e.g., input, output, persistent, and local).

For each variable, the table may display the name 731, original type 732, simulation range 733, 734, static/derived range 735, 736, a whole number flag 737, and proposed fixed-point type 738.

In some embodiments, the table 720 may be sortable and the columns may be resizable, but the columns may not be movable or hidable.

For static/derived range 735, 736, whole number flag 737, and proposed type 738 (the last three columns), the user may be able to edit the value in the table, either before or after it is populated with computed results.

User-edited values may also be marked in bold font.

In some embodiments, computing ranges 714 may not overwrite a user-edited value.

User-edited static/derived ranges may be used as input for static analysis 714 when it is run. However, editing these ranges may not result in automatic re-running of static analysis.

The user may undo an edit and restore the computed value (as well as restoring the ability to recompute the value) via the context menu in an edited table cell.

Ranges may be displayed with up to two fraction digits. Scientific notation may be used for numbers that do not fit.

Proposed fixed-point types 738 may be formatted as numerictype construction expressions.

When editing a proposed fixed-point type, the user may be given popup help, for example, similar to the input type definition User Interface in MATLAB Coder.

Part or all of the computed ranges may be reset after computing simulation or static ranges.

Computed ranges may be computed for both simulation and static analysis and may be selectively ignored in final range computation.

4. The Histogram View

Figure 12:
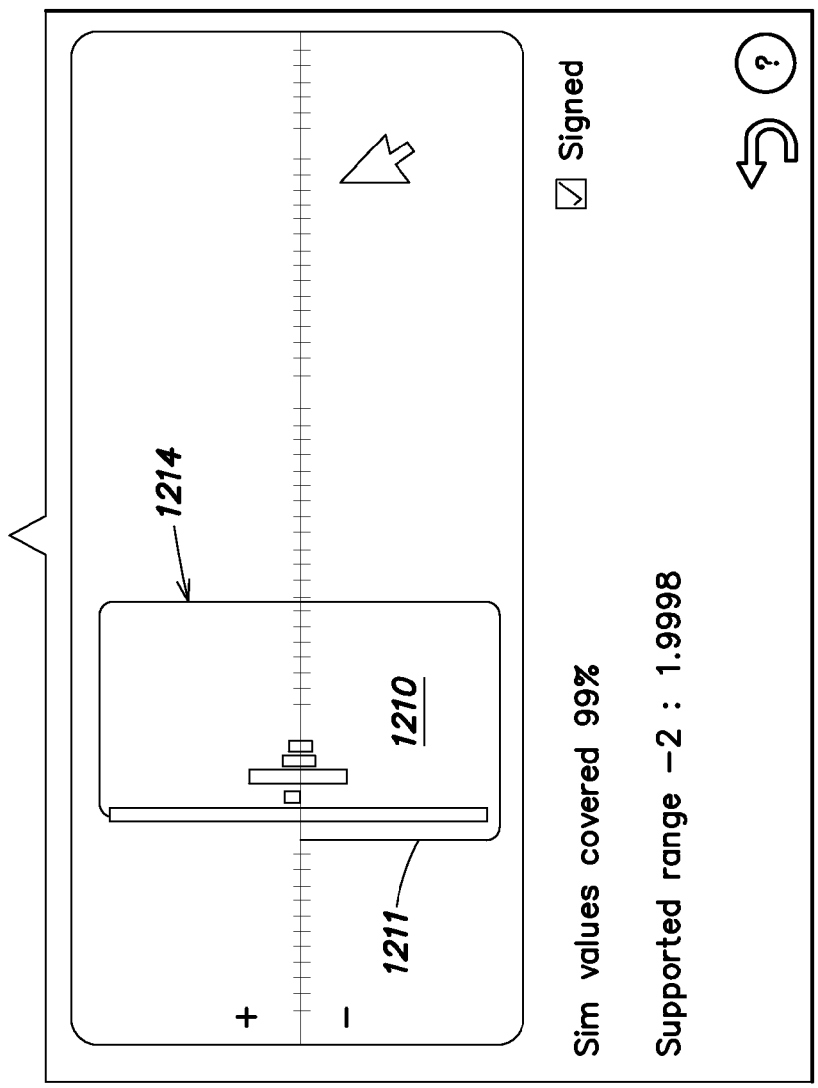
FIG. 12 is an example histogram view where the user may modify the proposed type through manipulation of a bounding box.

Refer to FIG. 12 for an example histogram view.

Each entry in the proposed type column 738 may be editable via such a histogram view as well. The user may modify the signedness, wordlength, fractionlength settings using this histogram view.

More specifically, when the user chooses an option to 'Log histogram data' during simulation (e.g. via execution of an instrumented MEX file) an additional histogram view may be made available. For example, the view shown in FIG. 12 may be enabled when the user clicks on the proposed type 738 for a specific variable. For each value encountered in the simulation, the histogram 1210 may plot a number of times the value is encountered on the y-axis, versus the values on the x-axis.

The rectangular bounding box 1210 of the histogram view may be moved using the mouse to change the numeric type.

Moving the entire bounding box 1210 left or right may keep the wordlength same but the position of the binary point may change, thus changing the fraction length setting.

Changing the left edge 1211 of the bounding box may resize the bounding box and may change the wordlength setting.

Changing the right edge 1214 of the bounding box may resize the bounding box and may change the fraction length setting.

A "sim values covered" value may display the percentage of the simulated values that would be covered by a fixed-point type defined by the bounding box 1210. This value may be updated as the bounding box 1210 is moved around The "Signed" check box may control the sign of the type proposal.

The user may commit the type proposal (e.g., by pressing the "enter" key) and also revert the changes (e.g., by pressing a "reset" button).

More details of the histogram view are discussed below in connection with FIGS. 21, 22 and 23.

5. The Code View

In an example embodiment, the code view may display the code for the selected file in a read-only instance of the MATLAB Editor. See item 730 in FIGS. 7 through 10 as previously described above.

Hovering over a variable or operator in the code may display a popup 1310 with information about that variable. See FIG. 13 for a detailed example.

The popup 1310 may contain the ranges, the proposed type, and the rounding method and overflow action.

Editing a field in pop up 1310 that also appears in the table 720 may cause the table 720 to update.

User-edited values may be indicated (e.g., appear in bold font) in the popup 1310, as well as in the table 720.

The data for expressions may be editable.

A default rounding method and overflow action may also be determined by an input setting (not shown in the figures).

6. Function Replacements

In an example embodiment, the tool may maintain a fixed-point function replacements table, if automatic conversion has been chosen. For example, if the MATLAB code uses functions that do not have built-in fixed-point support, the tool may list these functions on a FunctionReplacements tab 1410 available in the table 720 area. In the example embodiment shown in FIG. 14, a fixed-point Fast Fourier Transform (FFT) function replacement is available for a floating-point function call in the original code. If the user does not enter a replacement, the tool may use the type specified in the original MATLAB code for the function.

The function replacements table 1410 may also prompt the user to manually enter replacements for any functions being used that are known to lack built-in fixed-point support in the Coder. In that situation, the work flow may require the user to specify another source for the fixed-point code. The other source may be a custom, application-specific function written by the user or made available by another user.

In other instances, the conversion tool may automatically suggest fixed-point replacements for known, commonly used floating-point functions.

The user may be able to add and remove other function replacements in the list 1410 that are not prompted for or automatically generated.

Function replacements entered may be applied in the process of automatic fixed-point conversion at build time.

If a function known not to support fixed-point is not replaced, then automatic conversion may configure invocations of the function to use the original MATLAB type in the original model.

In some embodiments, the names of functions may be replaced through the function replacements feature.

Operators may also be replaced in an analogous way to function replacement as just described. For example, if an operator is an addition of two fixed-point variables of length N, the replacement operator can be one that provides an output of length N+1. If the operator is a multiply of an N bit by a M bit fixed-point variable, then the operator can produce an N×M bit result.

By using one or more of these function replacement mechanisms, the work flow may swap in hardware-efficient functions with minimal input from the user.

7. Type Validation

The tool may also provide an option to validate the fixed-point types, if the user has selected automatic fixed-point conversion. This is accessible via a dropdown menu 1510 in the table 720 area where the user can specify different verification output types; see FIG. 15.

Type validation may mean checking that the project builds the fixed-point C code (or HDL code, etc.) successfully using the proposed fixed-point types.

Type validation may be enabled after the proposed type column is populated. Therefore, in some embodiments, type validation may also not appear as an option for a manual workflow.

The result of type validation, either success or failure, may be an indication of success or failure of the automated conversion. In case of success, the user may receive warnings, if there are unsupported function usages that will not be converted to fixed-point.

When attempting to build the project, if validation has not been done, or the source code or proposed types have changed since validation was done, the user is warned.

8. Verifying Numerics

Some embodiments may provide an option to verify numerics by executing the resulting fixed-point code, for example, if automatic fixed-point conversion has been applied.

Verifying numerics means that the user runs the resulting fixed-point code, using a test file, and subjectively decides whether the results from the fixed-point code are tolerable.

The Verify Numerics option may be only enabled after type validation has already been performed.

The user can have the option of selecting a subset of the test files that were used for Run Simulation, and/or adding additional test files.

The selected test files can be run with automatic redirection to a test build of the automatically-generated fixed-point code.

The user may choose to enable automatic logging and comparison, in which case the tool will run the selected test files against both the original code and the fixed-point code, and show automatically generated comparison plots. Type validation may be a part of the type conversion workflow. For example, if automatic conversion fails, the user may have to start over with another approach to the fixed-point design. In the preferred workflow, the same test bench used for initial type proposal may be used for verification. More details of one preferred workflow for Verifying Numerics is provided in Section IV below.

9. Output Display

In some embodiments, there may also be a tab at the bottom of the tool that displays the output from various actions.

For example, there may be a separate output view for instrumented build, simulation output, static analysis output, type validation output, and verification output that are selected via the drop down box 1510. See the example in FIG. 15.

Output views for any of the above that have been run in the current session may be on an output tab in the table area 720 (not shown).

In other embodiments, the build output may be suppressed from the output tab, after the instrumented build, if it is successful with no warnings.

The output view for the last-run task may be the selected output view by default. This may be indicated on the tab header.

Re-running a task may clear and re-fill that task's associated output view.

In some embodiments, a drop-down on the output tab may allow the user to switch to the output from a prior task, but not a prior run of a given task.

The output view for simulation and verification may contain the textual output of the test file(s) as well as system-generated information.

10. Exit

In some embodiments, if automatic conversion has been chosen, the MATLAB Coder Build tab may indicate that automatic fixed-point conversion is still in the process of being performed. For example, an Overview tab (not shown in the drawings) may be placed anywhere in the tool bar. This Overview tab may indicate a current progress for a fixed-point conversion workflow. ???? Example states may include:

Type definitions needed: The user has not yet determined proposed types.

Update needed: The code has been changed and this may require the proposed types to be determined again.

Validation needed: The proposed types have been determined but have not been successfully validated against the current code.

Ready for conversion: Validation has been performed successfully on the current code and proposed types.

In some embodiments, the user may leave the fixed-point tool at any time, and the data displayed in the table and the code view may be automatically retained, along with any customized settings in a MATLAB project file.

In some embodiments, when re-entering the fixed-point tool, the table 720 may return to its prior state.

IV. Fixed-Point Design Verification Using the Floating-Point Workbench

Figure 16:
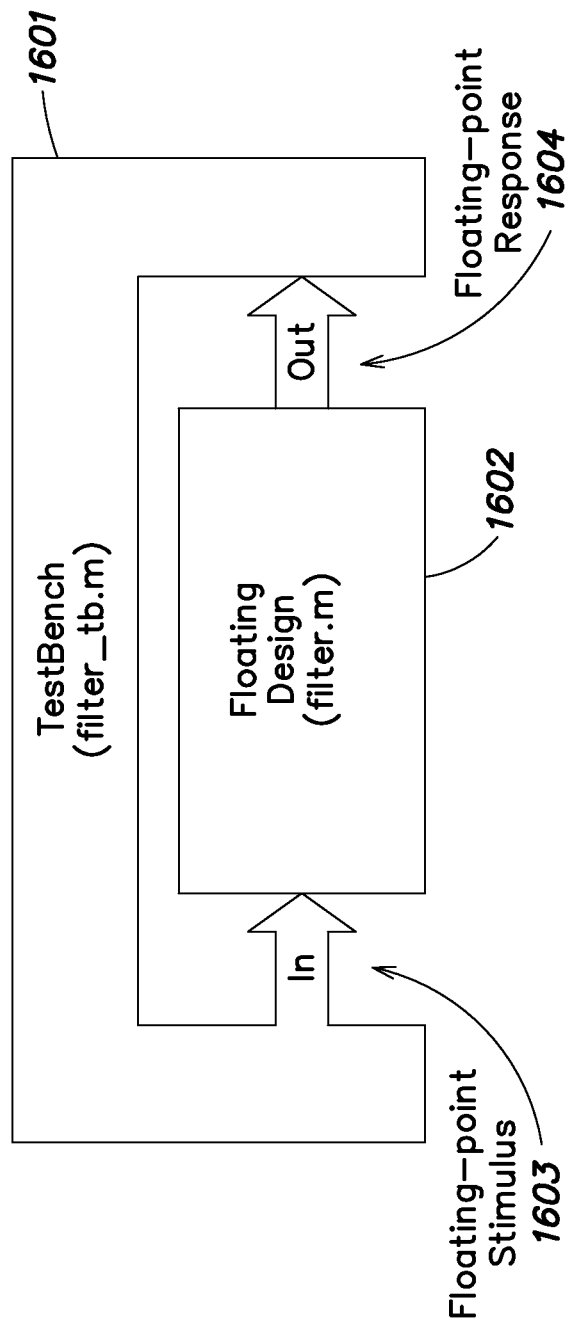
FIG. 16 shows an example relationship between an original floating-point design and a test bench.

In some embodiments, the original floating-point design and testbench may have a relationship as shown in FIG. 16. In this example, a floating-point design file for a filter (filter.m) is being submitted to a corresponding floating-point test bench 1601 file (filter_tb.m) that specifies floating-point input stimulus 1603 and receives floating-point output responses 1604.

In some embodiments, for floating-point to fixed-point conversion, the following attributes may apply to the original design and the testbench:

The testbench file 1601 is a script or a function with no inputs.

The design file 1602 is a function.

There is at least one call to the design 1602 from the testbench 1601. In some embodiments, both the design 1602 and testbench 1601 can call other sub-functions or other functions on the MATLAB project file path.

In the current example, the MATLAB testbench filter_tb.m 1601 has a single call to the design function filter.m 1602. The testbench 1601 calls the design 1602 with floating-point inputs and accumulates the floating-point results for plotting.

Figure 17:
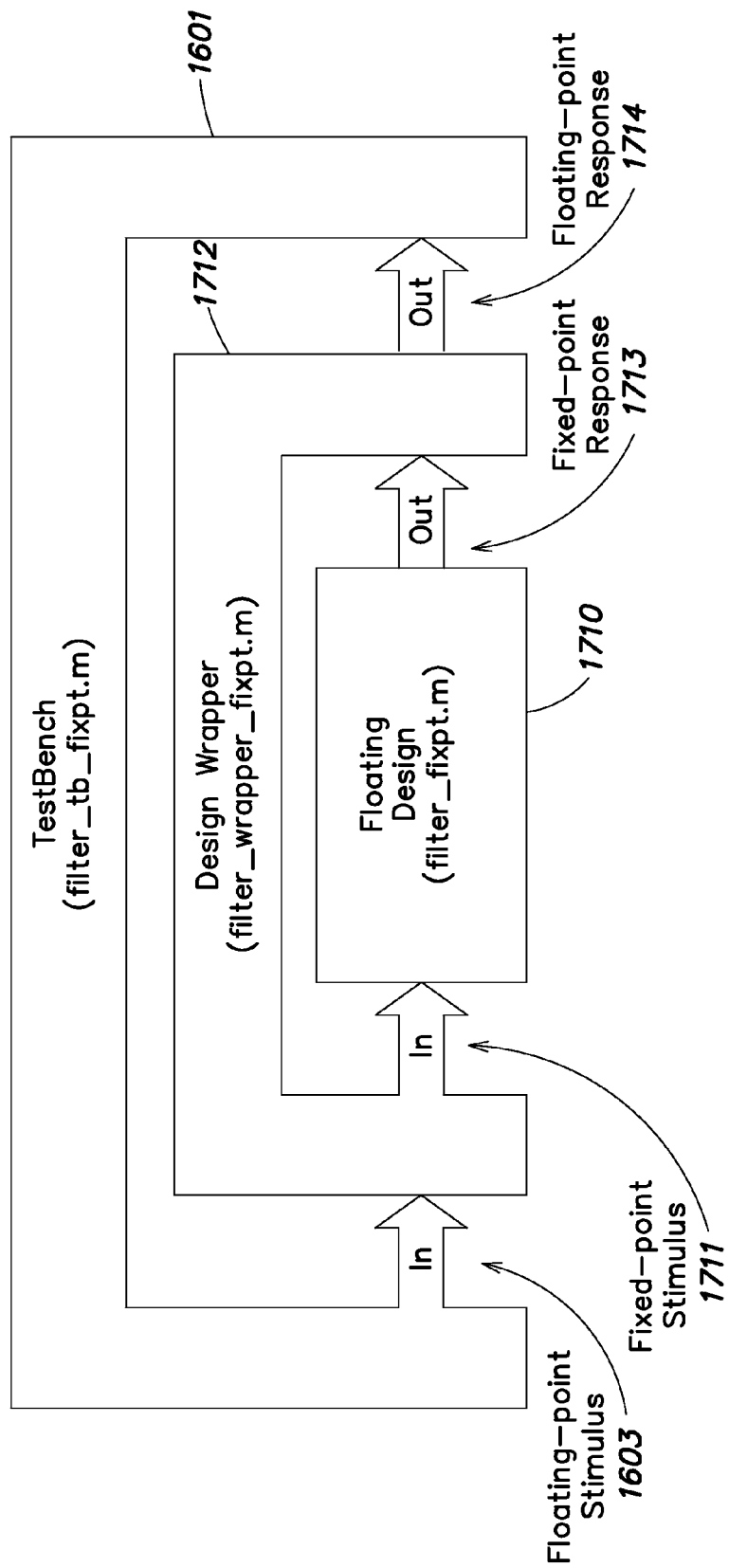
FIG. 17 shows an example relationship of the floating-point design, a design wrapper and the test bench in a fixed-point code validation process.

During the type validation process described above (See FIGS. 6A and 6B), fixed-point code is generated 517 for this design and compiled to verify that there are no errors when applying the types. The output files may have a "design wrapper" effect as shown in FIG. 17, such that the fixed-point design may be verified using the original floating-point test bench.

The following actions are an example of a workflow that may be performed during this fixed-point type validation process:

1. The design file "filter.m" is converted to fixed-point (e.g., after floating to fixed-point variable conversion in FIG. 6, block 517) to generate fixed-point MATLAB code, 'filter_FixPt.m' 1710. User-written functions called in the floating-point design 1602 are converted to fixed-point and included in the generated fixed-point design file 1710.

2. A new design wrapper file 1712 is created, called 'filter_wrapper_FixPt.m'. This file converts the floating-point data values 1603 supplied by the testbench 1601 to the fixed-point types 1711 determined for the design inputs during the conversion work flow. These fixed-point values are fed into the converted fixed-point design, 'filter_FixPt.m' 1710.

3. The function 'filter_FixPt.m' 1710 is then used for fixed-point HDL code (or C code, etc.) generation.

4. The resulting fixed-point response 1711 is converted to floating-point 1714 and returned to the testbench 1601 wrapper.

For converted variables, the user can (re)compute and propose (via tool option 715):

Whether the variable is signed or not (its "signedness"),

Fraction lengths for a given fixed-word length setting, and/or

Word lengths for a given fixed-fraction length setting.

When starting with a floating-point design and performing the floating-point to fixed-point conversion workflow for the first time, a 'Default Word Length' setting may be specified based on a largest dynamic range of the variables in the design. In this example workflow, a default word length of 16 is first specified before the 'Propose Fixed-Point Types' block is run.

Figure 18:
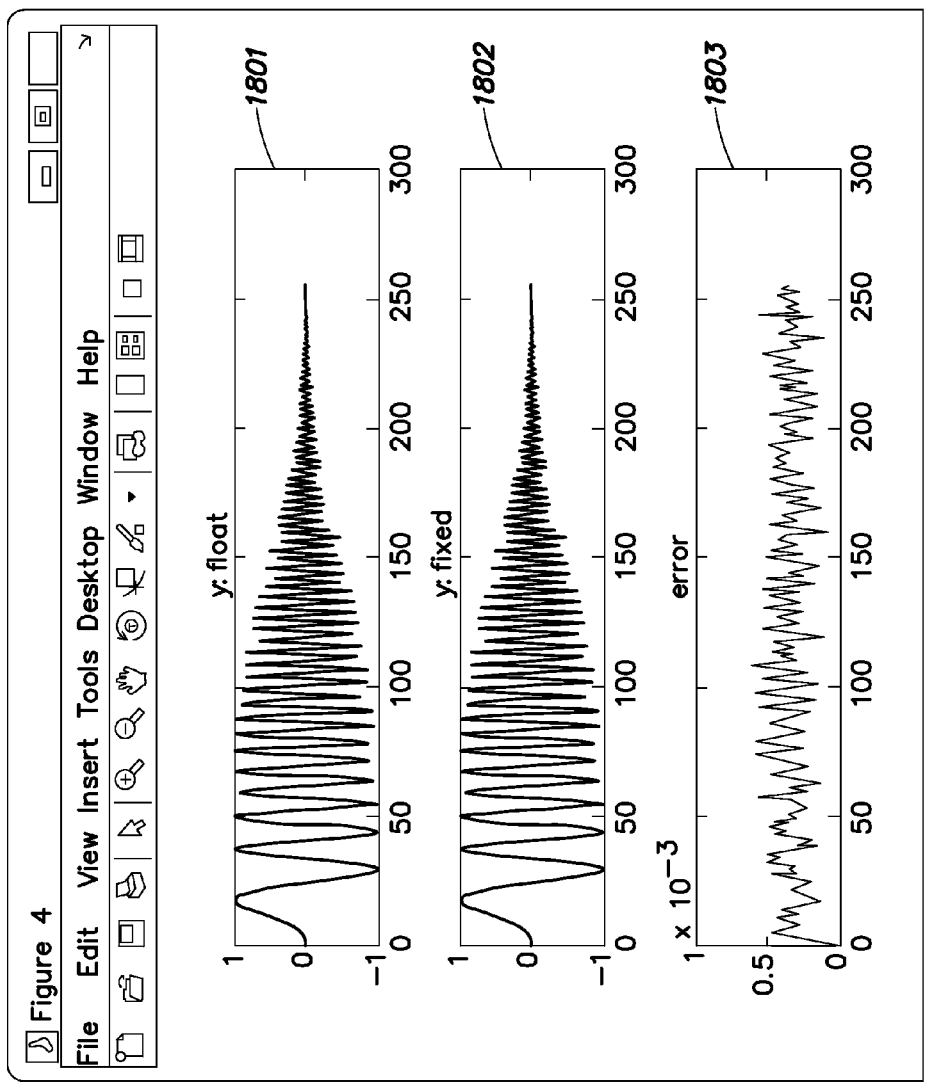
FIG. 18 is an example error graph comparing the performance of the floating-point variable to that of a fixed-point implementation.

By choosing a comparison plots option, the user may see additional plots such as that shown in FIG. 18. The plots compare the floating 1801 and fixed-point 1802 simulation results for a selected output variable (here, variable "y"). The resulting error graph 1803 for the output variable may then be examined to further determine if the proposed variable types result in an acceptable fixed-point design. For example, one way to reduce the error is to increase 'Default word length' option and repeat the fixed-point conversion and verification work flow.

While the graphs shown in FIG. 18 are a time series plot of a variable, it should be understood that these plots may take other forms. For example, if the variable is a digital communication system signal, a signal to raise ratio, bit error rate, or eye diagram plot may be a more informative comparison. If the variable is a radio signal, a frequency domain plot may better reveal the adequacy of the proposed floating to fixed-point conversion.

The tool thus allows users to make design choices and observe results of design choices through these plots. For example a user may increase/decrease word lengths (or other fixed-point conversion parameters) in the proposed fixed-point types based on the results of these comparison plots.

V. Additional Interface Examples

This section describes additional optional features that may be included with the examples already described.

In a first example shown in FIG. 19 the static ranges for input variables may be specified in the table 720. As previously described in connection with FIG. 9, these can be entered manually or automatically populated. A drop-down menu 1910 may for example, enable a user to copy the simulated ranges 733, 734 as output by the simulation 516 to the static ranges 735, 736. The user may also instead copy the simulated ranges for top level inputs, or to copy simulated ranges for persistent variables, etc. Options here may also include to clear manually entered static ranges, or reset the entire table.

With other options for the table 720 interface shown in FIG. 20, the user may decide whether or not to force a particular variable to a whole number (e.g., an integer). For example, even if the simulated or static analyses indicate that a whole number would not be representative of variable increments, the user may manually force that a whole number is to be used.

Figure 21:
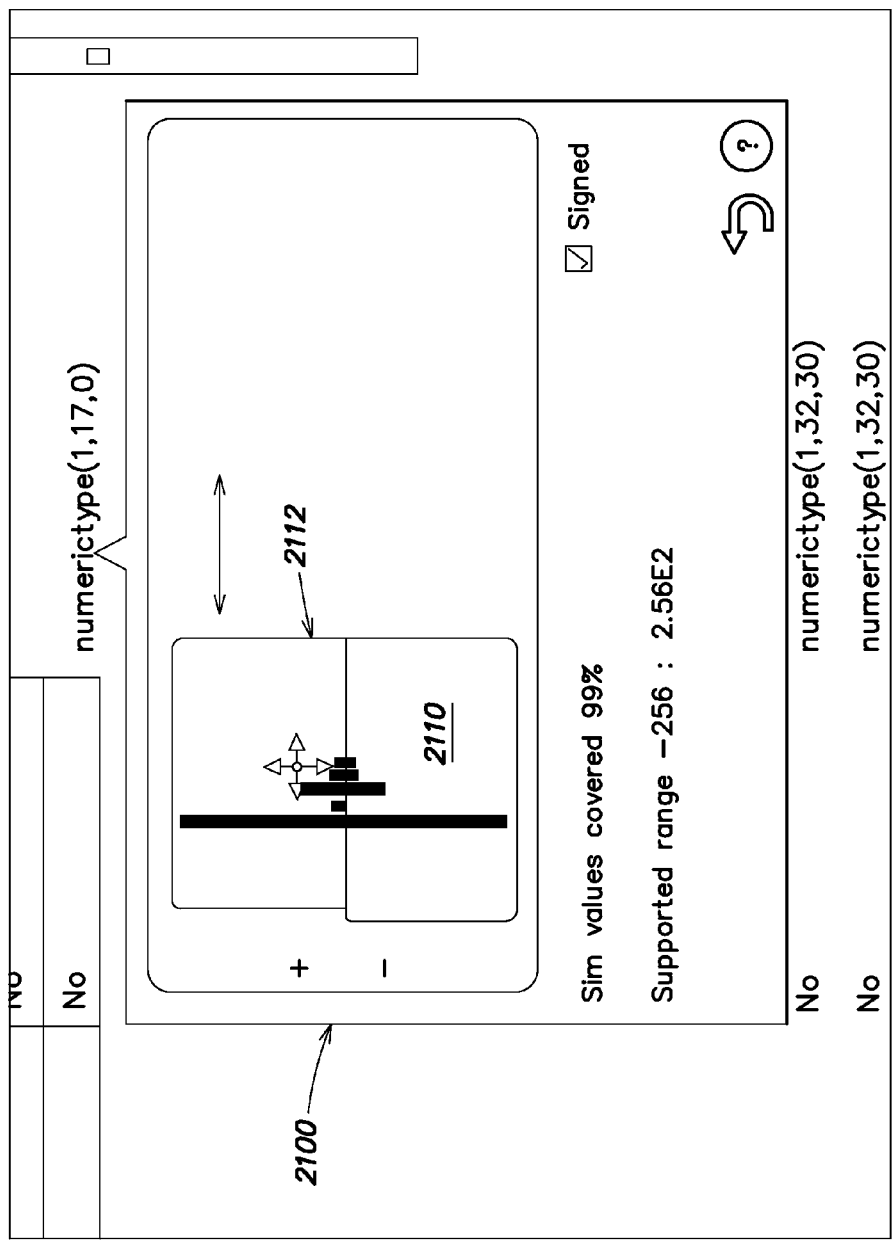
FIGS. 21, 22 and 23 are examples of how the user may manipulate a histogram window.
Figure 22:
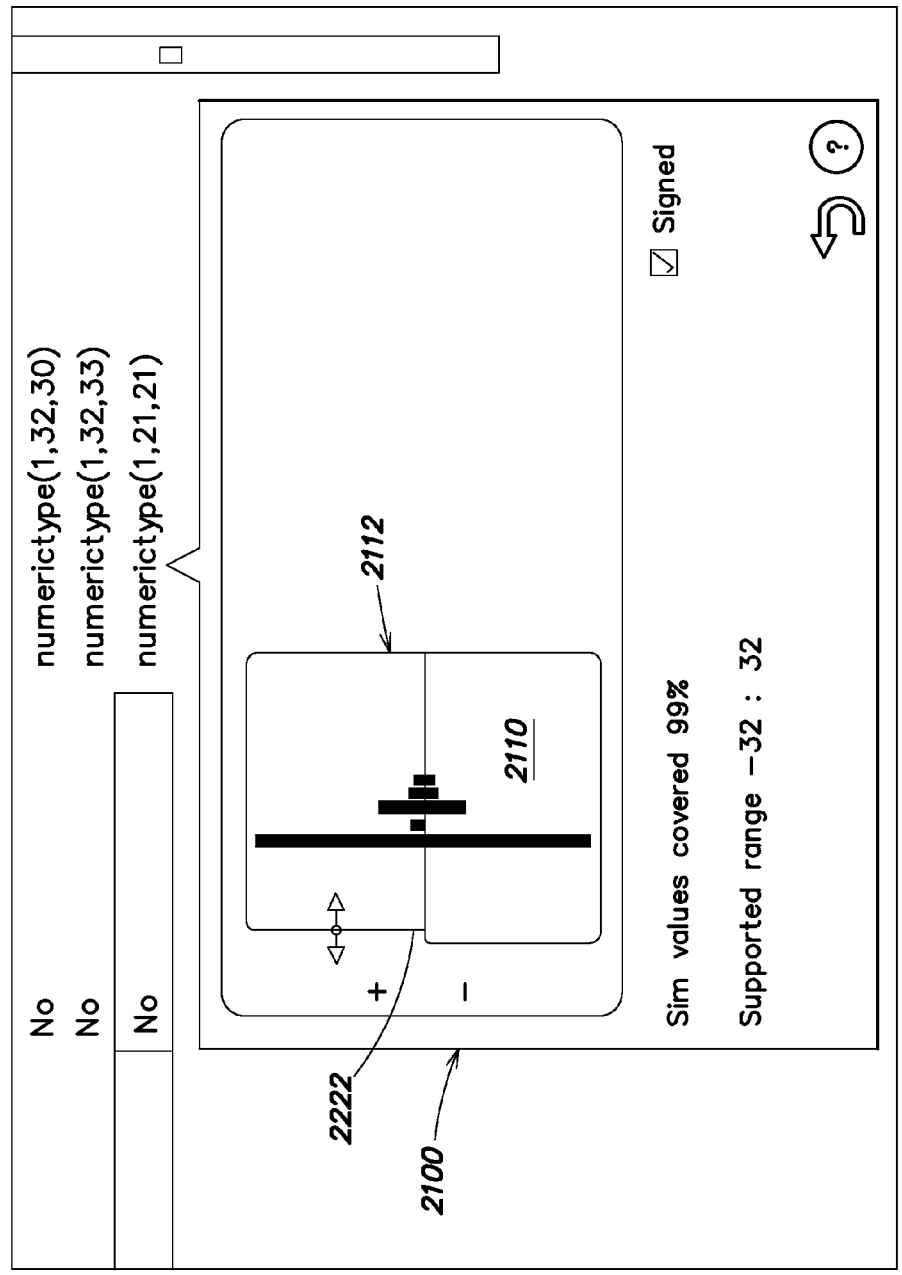
Figure 23:
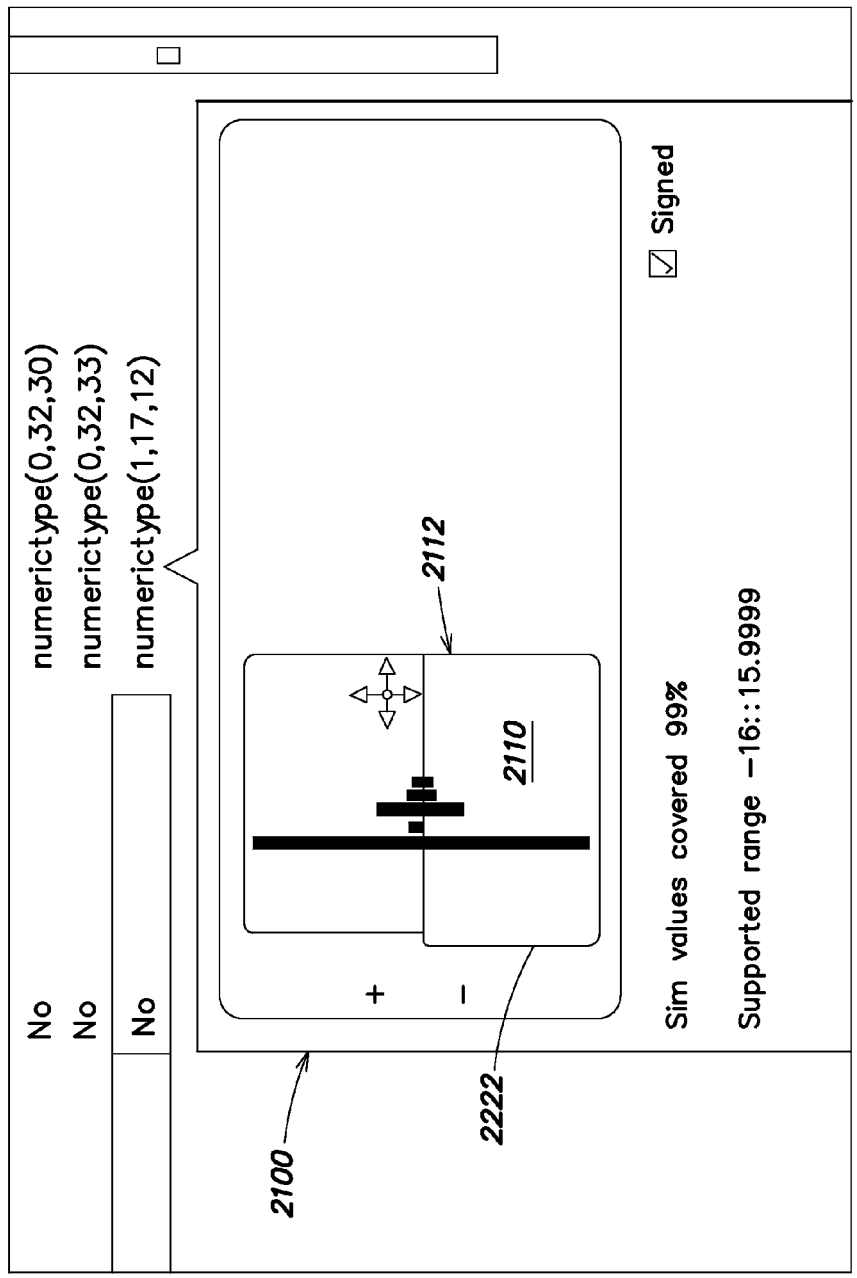

FIGS. 21, 22 and 23 indicate how the user may manipulate the histogram window (previously described in connection with FIG. 10) in more detail. The user may enable the histogram view with a specific variable numeric type field highlighted. In the example shown in FIG. 21, the suggested numeric type starts as a signed, 17-bit value with 8 bits dedicated to the fractional portion. In FIG. 22 the user has dragged the window to a different size and the tool has now automatically changed the word size to 27 bits and fractional portion to 21 bits accordingly. In FIG. 23 the user has again adjusted the window size and the tool has adjusted the numeric type arguments to 17 bits total and 12 bits fractional. The histogram window may also be moved to the left or the right to specify a word length or fractional part of the variable. A checkbox may also be used to change whether the variable is signed or is unsigned.

FIG. 24 is an example option window that illustrates further embellishments where the user may specify how the code will be generated in more detail. For example, code generation settings may include optimizing whole numbers, whether signs are to be used, a safety margin to be applied to the simulated min and max values, generated filename suffixes, transform for loops (for example allocated automatically to fixed integer values) and other options such as rounding methods, overflow actions, etc. These code generation options can further be added to menus such as that of FIG. 7.

VI. Further Observations

The system and methods described may improve aspects of a model-based design process. For example, these tools enable a user to develop algorithms for use in a DSP or FPGA while initiating algorithm development using high-level tools such as MATLAB. The user can be freed to easily develop and verify sophisticated algorithms while minimizing verifying fixed-point designs. Details such as the whether or not a variable should be signed, its word length, the position of the decimal and so forth can be left to later, mostly automated processes.

Results of code simulation may depend on a quality of test bench stimuli. For example, test input signals may not complete the exercise the full possible range for a variable that can be experienced by the system in a real implementation. Thus, addition of static analysis of the code can often more completely observe how an algorithm behaves and exercises a range of values. Tools such as the PolySpace static code analysis tool available in MATLAB can be used for verification of dynamic properties of a system variable.

Generated code such as C++ to be executed in a target programmable digital signal processor can be generated natively in the MATLAB environment. However, generating output code suitable for execution in other physical target such as HDL code for an FPGA can require interaction with external objects such as an external simulation engine, e.g., ModelSim™ from Mentor Graphics. In this instance the floating to fixed-point tool can interact with these external simulation engines to verify HDL code.

Environments such as MATLAB may provide support for floating to fixed conversion of polymorphic variables. These variables can assume different data types and the tool can return the appropriate result. For example, a polymorphic variable may be a integer, or a array of values depending on the code specification. The tool can automatically support different workflows based on the polymorphic variable types needed.

Verification and validation type analysis may also be integrated with the tool described here, including Condition Coverage (CC), Model Coverage (MC), Decision Coverage (DC) and Lookup Table (LUT).

What is claimed is:

1. A method performed using one or more computers comprising:
   receiving a design model for a dynamic system, the design model specifying at least one floating-point variable,
   obtaining a design range for the at least one floating-point variable;
   simulating the design model using one or more test bench stimuli to obtain a simulation range for the at least one floating-point variable;
   performing a static analysis of the design model using either the design range or the simulation range as inputs, to determine a static range for the at least one floating-point variable;
   automatically determining, using the one or more computers, at least one proposed fixed-point variable type to represent the at least one floating-point variable, the automatic determining using at least one of the simulation range and the static range; and
   generating a list of one or more floating-point variables from the design model and including, for each floating-point variable in the list of one or more floating-point variables:
   a simulation range including minimum and maximum values resulting from the simulating the design model;
   a static range including minimum and maximum values resulting from the determining static ranges from the design model; and
   a proposed fixed-point variable type.

2. The method of claim 1 additionally comprising: automatically generating fixed-point code using the at least one proposed fixed-point variable type.

3. The method of claim 2 additionally comprising:
   verifying the fixed-point code by comparing a result of executing the fixed-point code with a result of executing the design model.

4. The method of claim 3 additionally comprising:
   executing the fixed-point code using the same test bench as was used to execute the design model.

5. The method of claim 1 wherein a user input, provided after the automatically determining, selects the at least one variable type to be a determined fixed-point variable type.

6. The method of claim 1 additionally comprising, before automatically determining a proposed fixed-point variable type:
   accepting user input specifying conversion parameters for the automatically determining, the conversion parameters including one or more of a rounding method, overflow action, signedness, optimization for whole numbers, safety margin, transform for-loop index variables, product mode, or sum mode.

7. The method of claim 1 wherein simulating the design model is an instrumented model simulating operation.

8. The method of claim 1 additionally comprising: automatically generating fixed-point code using the proposed fixed-point variable type.

9. The method of claim 8 additionally comprising:
   accepting user input representing a modification to at least one of a variable range, a word length, a fractional part of a variable, or test bench stimuli.

10. The method of claim 9 wherein the accepting user input and the automatically generating are performed iteratively.

11. The method of claim 1 additionally comprising:
    generating a revised design model based at least in part on:
    the design model;
    floating-point to fixed-point conversion code for the floating-point variable; and
    the automatically generated fixed-point code.

12. The method of claim 11 additionally comprising:
    simulating the revised design model using the test bench stimuli; and
    comparing results of simulating the design model with results of simulating the revised design model to determine an error.

13. The method of claim 1 additionally comprising: automatically replacing floating-point functions in the design model with fixed-point functions corresponding to the proposed fixed-point variable type.

14. The method of claim 1 additionally comprising: displaying a histogram of values of at least one floating-point variable resulting from the simulating the design model.

15. The method of claim 1 wherein the static ranges are determined from a Polyspace-based estimate.

16. The method of claim 8 additionally comprising:
    simulating the design model via an instrumented executable for the design model.

17. The method of claim 16 further comprising:
obtaining user input designating changes to the proposed fixed-point variable type; and
generating a modified fixed-point variable type based on the obtained input.

18. The method of claim 17 additionally comprising:
automatically generating fixed-point code using the modified fixed-point variable type.

19. An apparatus comprising:
a receiver, for receiving a design model for a dynamic system, the design model specifying at least one floating-point variable;
a processor, for automatically performing the acts of:
   simulating operation of the design model to obtain a computed simulation range for the at least one floating-point variable;
   determining a static range for the at least one floating-point variable;
   determining a proposed fixed-point variable type to represent the at least one floating-point variable based on both the computed simulation range and the static range;
   generating fixed-point code representing the design model, the generating performed using the proposed fixed-point variable type;
   receiving a design model for a dynamic system, the design model specifying at least one floating-point variable,
   obtaining a design range for the at least one floating-point variable;
   simulating the design model using one or more test bench stimuli to obtain a simulation range for the at least one floating-point variable;
   performing a static analysis of the design model using either the design range or the simulation range as inputs, to determine a static range for the at least one floating-point variable;
   automatically determining, using the one or more computers, at least one proposed fixed-point variable type to represent the at least one floating-point variable, the automatic determining using at least one of the simulation range and the static range; and
   generating a list of one or more floating-point variables from the design model and including, for each floating-point variable in the list of one or more floating-point variables:
      a simulation range including minimum and maximum values resulting from the simulating the design model;
      a static range including minimum and maximum values resulting from the determining static ranges from the design model; and
      a proposed fixed-point variable type.

20. A non-transitory machine-readable medium storing executable instructions to facilitate conversion of a design model, the executable instructions, when executed by a processor, causing an apparatus to perform at least the following:
   simulating operation of the design model to obtain a computed simulation range for the at least one floating-point variable;
   determining a static range for the at least one floating-point variable;
   determining a proposed fixed-point variable type to represent the at least one floating-point variable based on both the computed simulation range and the static range;
   generating fixed-point code representing the design model, the generating performed using the proposed fixed-point variable type;
   receiving a design model for a dynamic system, the design model specifying at least one floating-point variable,
   obtaining a design range for the at least one floating-point variable;
   simulating the design model using one or more test bench stimuli to obtain a simulation range for the at least one floating-point variable;
   performing a static analysis of the design model using either the design range or the simulation range as inputs, to determine a static range for the at least one floating-point variable;
   automatically determining, using the one or more computers, at least one proposed fixed-point variable type to represent the at least one floating-point variable, the automatic determining using at least one of the simulation range and the static range; and
   generating a list of one or more floating-point variables from the design model and including, for each floating-point variable in the list of one or more floating-point variables:
      a simulation range including minimum and maximum values resulting from the simulating the design model;
      a static range including minimum and maximum values resulting from the determining static ranges from the design model; and
      a proposed fixed-point variable type.

* * * * *

UNITED STATES PATENT AND TRADEMARK OFFICE
CERTIFICATE OF CORRECTION

PATENT NO. : 9,436,442 B1  
APPLICATION NO. : 14/097942  
DATED : September 6, 2016  
INVENTOR(S) : Kintali et al.

Page 1 of 1

It is certified that error appears in the above-identified patent and that said Letters Patent is hereby corrected as shown below:

In the Specification  
Column 16, Line 43:  
Delete "fixed-point conversion workflow. ???? Example states may"  
Insert --fixed-point conversion workflow. Example states may--

Signed and Sealed this  
Ninth Day of May, 2017

Michelle K. Lee  
*Director of the United States Patent and Trademark Office*